(12) United States Patent
Tsai et al.

(10) Patent No.: US 12,713,658 B2
(45) Date of Patent: Aug. 18, 2026

(54) SEMICONDUCTOR DEVICE WITH ENHANCED MOBILITY AND METHOD OF FORMING THE SAME

(71) Applicant: Taiwan Semiconductor Manufacturing Company, Ltd., Hsinchu (TW)

(72) Inventors: Wu-Wei Tsai, Taoyuan City (TW); Po-Ting Lin, Taichung City (TW); Kai-Wen Cheng, Taichung City (TW); Sai-Hooi Yeong, Hsinchu County (TW); Han-Ting Tsai, Kaoshiung (TW); Ya-Ling Lee, Hsinchu (TW); Hai-Ching Chen, Hsinchu (TW); Chung-Te Lin, Tainan City (TW); Yu-Ming Lin, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 665 days.

(21) Appl. No.: 17/857,021

(22) Filed: Jul. 3, 2022

(65) Prior Publication Data

US 2024/0006538 A1 Jan. 4, 2024

(51) Int. Cl.

| | |
|---|---|
| ***H10D 30/67*** | (2025.01) |
| ***H10B 51/30*** | (2023.01) |
| ***H10D 30/01*** | (2025.01) |

(52) U.S. Cl.

CPC ......... *H10D 30/6755* (2025.01); *H10B 51/30* (2023.02); *H10D 30/031* (2025.01)

(58) Field of Classification Search

CPC .......... H01L 29/7869; H01L 29/66742; H10B 51/30

See application file for complete search history.

(56) References Cited

U.S. PATENT DOCUMENTS

| | | | | |
|---|---|---|---|---|
| 2018/0075900 A1* | 3/2018 | Ishizu | ................... | G11C 11/419 |
| 2018/0226435 A1* | 8/2018 | Hsu | ..................... | H10D 30/6755 |
| 2020/0144310 A1* | 5/2020 | Kato | ..................... | H10D 86/481 |
| 2021/0408291 A1* | 12/2021 | Sharma | .............. | H10D 30/6755 |
| 2022/0328486 A1* | 10/2022 | Onuki | ..................... | H10B 12/00 |

FOREIGN PATENT DOCUMENTS

| | | | |
|---|---|---|---|
| KR | 2017096956 A * | 8/2017 | ......... H01L 27/1222 |

* cited by examiner

*Primary Examiner* — Eliseo Ramos Feliciano
*Assistant Examiner* — Timothy Edward Duren
(74) *Attorney, Agent, or Firm* — JCIPRNET

(57) ABSTRACT

A method of forming a semiconductor device is provided. A gate electrode is formed within an insulating layer that overlies a substrate. A gate dielectric layer is formed over the gate electrode. A first oxide semiconductor layer is formed over the gate dielectric layer. A dielectric layer is formed over the first oxide semiconductor layer. The dielectric layer and the first oxide semiconductor layer are patterned, so as to form first and second openings that expose portions of the gate dielectric layer. An interfacial layer is conformally formed on sidewalls and bottoms of the first and second openings. A second oxide semiconductor layer is formed over the interfacial layer in the first and second openings. A metal layer is formed over the second oxide semiconductor layer in the first and second openings.

20 Claims, 21 Drawing Sheets

SEMICONDUCTOR DEVICE WITH ENHANCED MOBILITY AND METHOD OF FORMING THE SAME

BACKGROUND

Technical Field

The present disclosure is related to a semiconductor device with enhance mobility and a method of forming the same.

Description of Related Art

Semiconductor devices are used in a variety of electronic applications, such as personal computers, cell phones, digital cameras, and other electronic equipment. Some semiconductor devices such as thin film transistors have attracted high attention due to the associated low cost, room temperature manufacturing process, high mobility for high speed operation, and the compatibility with transparent, flexible and light display applications. Although the existing semiconductor devices have generally been adequate for their intended purposes, they have not been entirely satisfactory in all respects.

SUMMARY

According to an aspect of the present disclosure, a method of forming a semiconductor device is provided. The method may include the operations of: forming a gate electrode within an insulating layer that overlies a substrate; forming a gate dielectric layer over the gate electrode; forming a first semiconductor layer over the gate dielectric layer; forming a dielectric layer over the first semiconductor layer; patterning the dielectric layer and the first semiconductor layer, so as to form first and second openings that expose portions of the gate dielectric layer; forming an interfacial layer conformally on sidewalls and bottoms of the first and second openings; forming a second semiconductor layer over the interfacial layer in the first and second openings; and forming a metal layer over the second semiconductor layer in the first and second openings.

According to an aspect of the present disclosure, a method of forming a semiconductor device is provided. The method may include the operations of: forming a gate electrode within an insulating layer that overlies a substrate; forming a gate dielectric layer over the gate electrode; forming a blocking layer on the gate dielectric layer; forming a first semiconductor layer over the blocking layer; forming a dielectric layer over the first semiconductor layer; patterning the dielectric layer, the first semiconductor layer and the blocking layer, so as to form first and second openings that expose portions of the gate dielectric layer; forming a second semiconductor layer in the first and second openings; and forming a metal layer over the second semiconductor layer in the first and second openings.

According to an aspect of the present disclosure, a semiconductor device includes: a gate electrode embedded by an insulating layer over a substrate; a gate dielectric layer disposed over the gate electrode; an active layer disposed over the gate dielectric layer; a dielectric layer disposed over the active layer; and a source electrode and a drain electrode penetrating through the dielectric layer and the active layer and in contact with the gate dielectric layer. In some embodiments, the source electrode includes, from bottom to top, a first interfacial liner, a first buffer layer and a first metal fill layer, and the drain electrode includes, from bottom to top, a second interfacial liner, a second buffer layer and a second metal fill layer. In some embodiments, the first interfacial liner is more conductive than the first buffer layer, and the second interfacial liner is more conductive than the second buffer layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
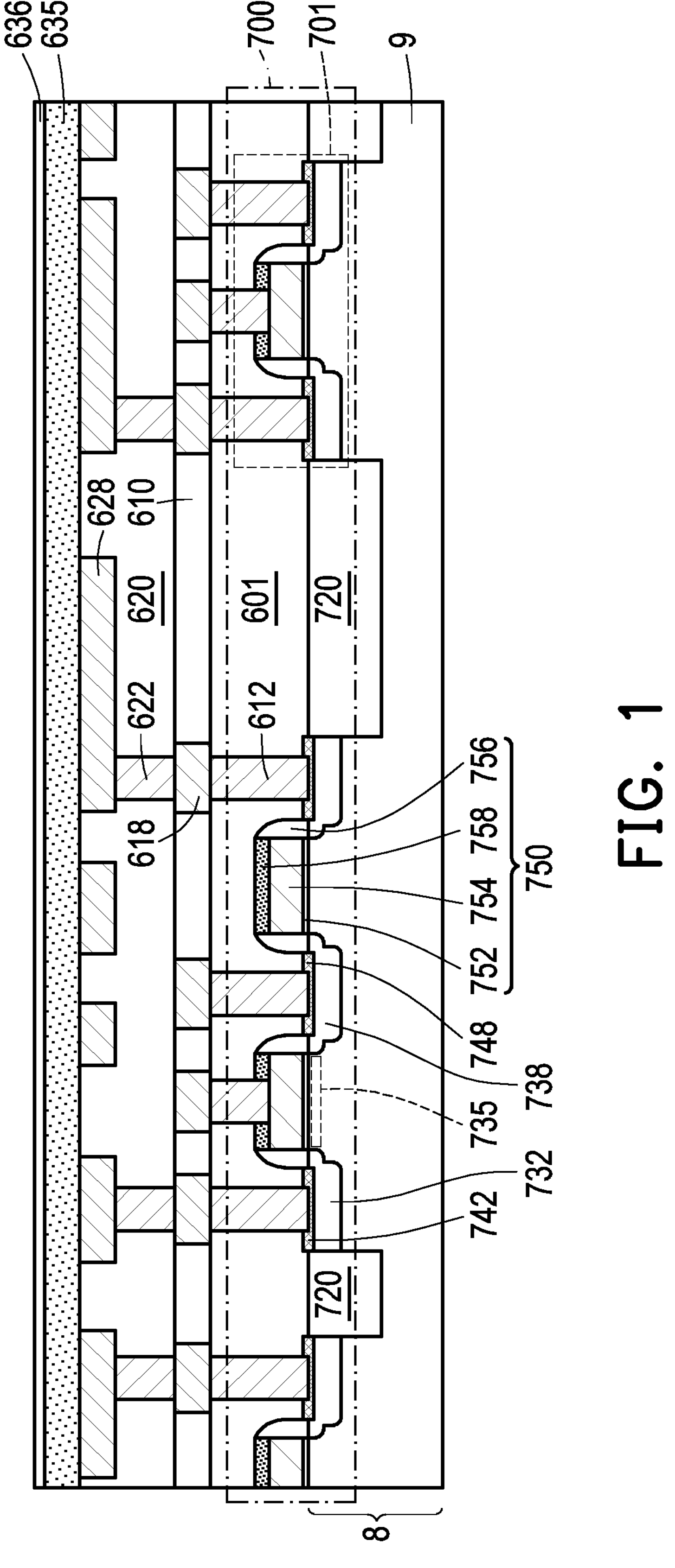
FIG. 1 to FIG. 13 illustrate cross-sectional views of a method of forming a semiconductor device in accordance with some embodiments of the present disclosure.
Figure 2:
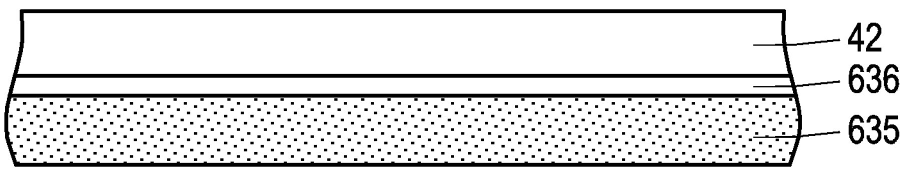

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

A semiconductor structure such as a thin film transistors (TFT) made of oxide semiconductor materials are an attractive option for back-end-of-line (BEOL) integration since the TFT may be processed at low temperatures and thus, will not damage previously fabricated devices. For example, the fabrication conditions and techniques may not damage previously fabricated front-end-of-line (FEOL) and middle end-of-line (MEOL) devices.

Generally, the structures and methods of the present disclosure may be used to form a semiconductor structure including one or more TFT devices. The TFT devices may be formed over any substrate, which may be an insulating substrate, a conductive substrate, or a semiconducting substrate. In embodiments that utilize a conductive substrate or a semiconductor substrate, at least one insulating layer may be used to provide electrical isolation between the thin film transistors and the underlying substrate. In embodiments in which a semiconductor substrate such as a single crystalline silicon substrate is used, field effect transistors using portions of the semiconductor substrate as semiconductor channels may be formed on the semiconductor substrate, and metal interconnect structures embedded in interconnect-level dielectric layers may be formed over the field effect transistors. The thin film transistors may be formed over the field effect transistors including single crystalline semiconductor channels and over the metal interconnect features, which are herein referred to as lower-level metal interconnect features.

Referring to FIG. 1, a substrate 8 is provided. The substrate 8 may be a semiconductor substrate such as a silicon substrate. The substrate 8 may include a semiconductor material layer 9 at least in the upper portion thereof. The semiconductor material layer 9 may be a surface portion of a bulk semiconductor substrate, or may be a top semiconductor layer of a semiconductor-on-insulator (SOI) substrate. In some embodiments, the semiconductor material layer 9 includes a single crystalline semiconductor material such as single crystalline silicon. In some embodiments, the substrate 8 may be a single crystalline silicon substrate.

Shallow trench isolation structures 720 including a dielectric material such as silicon oxide may be formed in the upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

In embodiments in which an array of memory cells may be subsequently formed at a level of a dielectric layer, the field effect transistors 701 may include a circuit that provides functions that operate the array of memory cells. Specifically, devices in the peripheral region may be configured to control the programming operation, the erase operation, and the sensing (read) operation of the array of memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In some embodiments, the field effect transistors 701 in the CMOS circuitry 700 may include a respective node that is subsequently electrically connected to a node of a respective ferroelectric memory cell to be subsequently formed. For example, the field effect transistors 701 in the CMOS circuitry 700 may include a respective source electrode 732 or a respective drain electrode 738 that is subsequently electrically connected to a node of a respective ferroelectric memory cell to be subsequently formed.

In some embodiments, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric layer in a selected ferroelectric memory cell into a first polarization state in which electrical polarization in the ferroelectric dielectric layer points toward a first electrode of the selected ferroelectric memory cell, and to provide a second programming pulse that programs the ferroelectric dielectric layer in the selected ferroelectric memory cell into a second polarization state in which the electrical polarization in the ferroelectric dielectric layer points toward a second electrode of the selected ferroelectric memory cell.

According to an aspect of the present disclosure, the field effect transistors 701 may be subsequently electrically connected to drain electrodes and gate electrodes of access transistors including active layers to be formed above the field effect transistors 701. In some embodiments, a subset of the field effect transistors 701 may be subsequently electrically connected to at least one of the drain electrodes and the gate electrodes. For example, the field effect transistors 701 may include first word line drivers configured to apply a first gate voltage to first word lines through a first subset of lower-level metal interconnect features to be subsequently formed, and second word line drivers configured to apply a second gate voltage to second word lines through a second subset of the lower-level metal interconnect features. Further, the field effect transistors 701 may include bit line drivers configured to apply a bit line bias voltage to bit lines to be subsequently formed, and sense amplifiers configured to detect electrical current that flows through the bit lines during a read operation.

Various metal interconnect features formed within dielectric layers may be subsequently formed over the substrate 8 and the semiconductor devices thereon (such as field effect transistors 701). In an illustrative example, the dielectric layers may include, for example, a first dielectric layer 601 that may be a layer that surrounds the contact structure connected to the source and drains (sometimes referred to as a contact-level dielectric layer 601), a first interconnect-level dielectric layer 610, and a second interconnect-level dielectric layer 620. The metal interconnect features may include metal contacts 612 formed in the first dielectric layer 601 and electrically connected to a respective component of the CMOS circuitry 700, first metal lines 618 formed in the first interconnect-level dielectric layer 610, first metal vias 622 formed in a lower portion of the second interconnect-level dielectric layer 620, and second metal lines 628 formed in an upper portion of the second interconnect-level dielectric layer 620.

Each of the dielectric layers (601, 610, 620) may include a dielectric material such as undoped silicate glass, a doped silicate glass, organosilicate glass, amorphous fluorinated carbon, porous variants thereof, or a combination thereof. Each of the metal interconnect features (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, or WC, and each metallic fill material portion may include W, Cu, Al, Co, Ru, Mo, Ta, Ti, an alloy thereof, or a combination thereof. Other suitable metallic liner and metallic fill materials within the contemplated scope of disclosure may also be used. In some embodiments, the first metal vias 622 and the second metal lines 628 may be formed as integrated line and via structures by a dual damascene process. The dielectric layers (601, 610, 620) are herein referred to as lower-lower-level dielectric layers. The metal interconnect features (612, 618, 622, 628) formed within in the lower-level dielectric layers are herein referred to as lower-level metal interconnect features.

While the present disclosure is described using an embodiment wherein thin film transistors may be formed over the second interconnect-level dielectric layer 620, other embodiments are expressly contemplated herein in which the array of memory cells may be formed at a different metal interconnect level. Further, while the present disclosure is described using an embodiment in which a semiconductor substrate is used as the substrate 8, embodiments are expressly contemplated herein in which an insulating substrate or a conductive substrate is used as the substrate 8.

The set of all dielectric layer that are formed prior to formation of an array of thin film transistors or an array of ferroelectric memory cells is collectively referred to as lower-level dielectric layers (601, 610, 620). The set of all metal interconnect features that is formed within the lower-level dielectric layers (601, 610, 620) is herein referred to as first metal interconnect features (612, 618, 622, 628). Generally, first metal interconnect features (612, 618, 622, 628) formed within at least one lower-level dielectric layer (601, 610, 620) may be formed over the semiconductor material layer 9 that is located in the substrate 8.

According to an aspect of the present disclosure, thin film transistors may be subsequently formed in a metal interconnect level that overlies that metal interconnect levels that contain the lower-level dielectric layers (601, 610, 620) and the first metal interconnect features (612, 618, 622, 628). In some embodiments, a planar insulating layer 635 having a uniform thickness may be formed over the lower-level dielectric layers (601, 610, 620). The planar insulating layer is referred to as an "insulating substrate" or "dielectric substrate" in some examples. The insulating layer 635 includes a dielectric material such as undoped silicate glass, a doped silicate glass, organosilicate glass, or a porous dielectric material, and may be deposited by chemical vapor deposition. The thickness of the insulating layer 635 may be in a range from about 20 nm to 300 nm, although lesser and greater thicknesses may also be used.

The interconnect-level dielectric layers (such as the lower-level dielectric layer (601, 610, 620)) containing therein the metal interconnect features (such as the first metal interconnect features (612, 618, 622, 628)) may be formed over semiconductor devices. The insulating layer 635 may be formed over the interconnect-level dielectric layers.

In some embodiments, the substrate 8 may include a single crystalline silicon substrate, and lower-level dielectric layers (601, 610, 620) embedding lower-level metal interconnect features (612, 618, 622, 628) may be located above the single crystalline silicon substrate. Field effect transistors 701 including a respective portion of the single crystalline silicon substrate as a channel may be embedded within the lower-level dielectric layers (601, 610, 620). The field effect transistors may be subsequently electrically connected to at least one of a gate electrode, a source electrode, and a drain electrode of one or more, or each, of thin film transistors to be subsequently formed.

An etch stop dielectric layer 636 may be optionally formed over the insulating layer 635. The etch stop dielectric layer 636 includes an etch stop dielectric material providing higher etch resistance to an etch chemistry during a subsequently etch process that etches a dielectric material to be subsequently deposited over the etch stop dielectric layer 636. For example, the etch stop dielectric layer 636 may include silicon carbide nitride, silicon nitride, silicon oxynitride, or a dielectric metal oxide such as aluminum oxide. The thickness of the etch stop dielectric layer 636 may be in a range from about 2 nm to 40 nm, such as from 4 nm to 20 nm, although lesser and greater thicknesses may also be used.

For simplicity and clarity, FIG. 2 to FIG. 12 illustrate a local region which corresponds to an area in which a TFT device 400 is to be subsequently formed. While the present disclosure is described using a single instance of a thin film transistor, it is understood that multiple instances of the thin film transistor may be simultaneously formed in any of the exemplary structures of the present disclosure.

An insulating layer 42 may be formed over the optional etch stop dielectric layer 636 or the insulating layer 635 (in embodiments in which the etch stop dielectric layer 636 is not used). The insulating layer 42 includes a dielectric material such as undoped silicate glass, a doped silicate glass, organosilicate glass, or a porous dielectric material. In some embodiments, the method of forming the insulating layer 42 includes performing a suitable deposition process, such as a physical vapor deposition (PVD) process, a chemical vapor deposition (CVD) process, a plasma enhanced CVD (PECVD) process, an atomic layer deposition (ALD), or the like. The thickness of the insulating layer 42 may be in a range from about 20 nm to 300 nm, although lesser and greater thicknesses may also be used. At least one thin film transistor may be subsequently formed over the insulating layer 42.

Figure 3:
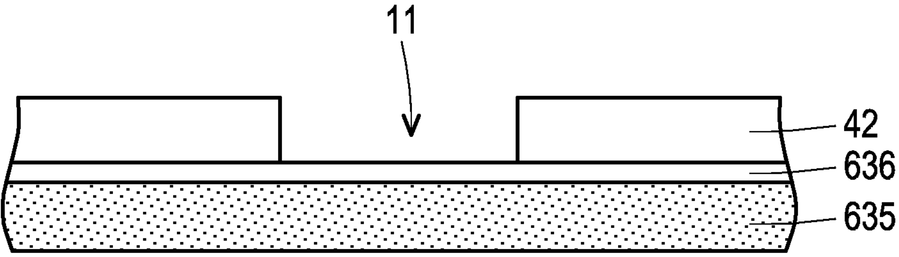

Referring to FIG. 3, an opening 11 may be formed through the insulating layer 42. The opening 11 exposes the a top surface of the optional etch stop dielectric layer 636 or a top surface of the insulating layer 635 (in embodiments in which the etch stop dielectric layer 636 is not used). The opening 11 is referred to as "recess region" or "bottom gate trench" in some examples. In some embodiments, the method of forming the opening 11 includes performing photolithography and etching processes. In some embodiments, the width of the opening 11 may be in a range from about 20 nm to 300 nm, although lesser and greater widths may also be used.

Figure 4:
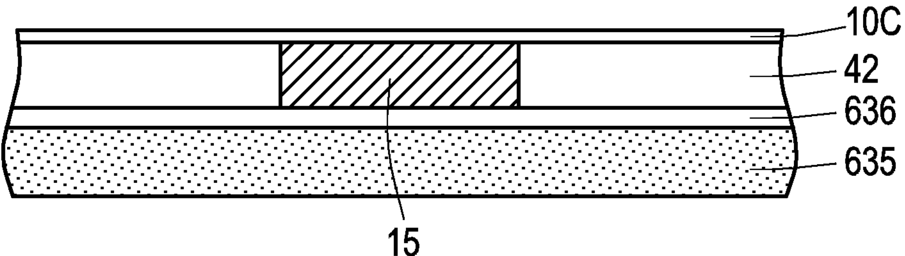

Referring to FIG. 4, at least one conductive material may be deposited in the opening 11. The at least one conductive material may include, for example, a metallic barrier liner material (such as TiN, TaN, WN or the like) and a metallic fill material (such as Cu, W, Mo, Co, Ru or the like). Other suitable metallic liner and metallic fill materials within the contemplated scope of disclosure may also be used. Excess portions of the at least one conductive material may be removed from above the horizontal plane including the top surface of the insulating layer 42 by a planarization process. The planarization process may use a chemical mechanical polishing process, a recess etch process or a combination thereof. A bottom gate electrode 15 may be formed in the opening 11. In some embodiments, the top surface of the bottom gate electrode 15 may be flushed with the top surface of the insulating layer 42. In some embodiments, the top surface of the bottom gate electrode 15 may be slightly recessed with respect to the top surface of the insulating layer 42.

Thereafter, a continuous bottom gate dielectric layer 10C may be deposited over the insulating layer 42 and the bottom gate electrode 15. In some embodiments, the continuous bottom gate dielectric layer 10C includes silicon oxide, silicon oxynitride or the like. However, the present disclosure is not limited thereto. In some embodiments, the continuous bottom gate dielectric layer 10C includes a high-k material having a dielectric constant greater than about 4, greater than about 10 or even greater than about 20, such as lanthanum oxide ($La_2O_3$), strontium oxide (SrO), zirconium dioxide ($ZrO_2$), aluminum oxide ($Al_2O_3$), hafnium oxide ($HfO_2$), tantalum oxide ($Ta_2O_5$), hafnium silicon oxide (HfSiO), hafnium silicon oxynitride (HfSiON), hafnium tantalum oxide (HfTaO), hafnium titanium oxide (HfiO), hafnium zirconium oxide (HfZrO), zirconium silicate, zirconium aluminate, titanium oxide, a hafnium dioxide-aluminum oxide ($HfO_2$:$Al_2O_3$) mixture, the like, or a combination thereof. Other suitable gate dielectric materials are within the contemplated scope of the present disclosure. In some embodiments, the gate dielectric layer is a single layer such as a silicon oxide layer or a high-k layer. In other embodiments, the continuous bottom gate dielectric layer 10C has a multi-layer structure (e.g., including a lower silicon oxide layer and an upper high-k layer). In some embodiments, the continuous bottom gate dielectric layer 10C include $HfO_x$:$ZrO_y$, $HfO_x$:$AlO_y$; $HfO_x$:$LaO_y$, $HfO_x$:$SiO_y$, $HfO_x$:$SrO_y$, $SiO_x$, $AlO_y$, HfZrO doped $CeO_2$, the like, or a combination thereof, in which each x and each y may be an independent variable that is greater than zero. In some embodiments, the continuous bottom gate dielectric layer 10C include $HfO_2$:$ZrO_2$, $HfO_2$:$Al_2O_3$; $HfO_2$:$La_2O_3$, $HfO_2$:$SiO_2$, $HfO_2$:SrO, $SiO_2$, $Al_2O_3$, HfZrO doped $CeO_2$, the like, or a combination thereof. In some embodiments, the method of forming the continuous bottom gate dielectric layer 10C includes performing a suitable deposition process, such as a physical vapor deposition (PVD) process, a chemical vapor deposition (CVD) process, a plasma enhanced CVD (PECVD) process, an atomic layer deposition (ALD), or the like. The thickness of the continuous bottom gate dielectric layer 10C may be in a range from about 1 nm to 12 nm, such as from 2 nm to 6 nm, although lesser and greater thicknesses may also be used.

Figure 5:
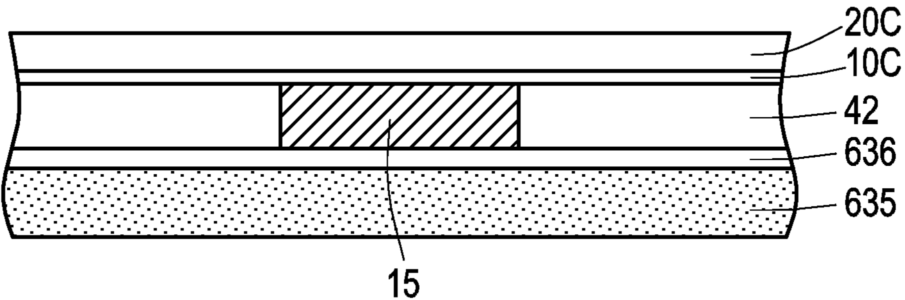

Referring to FIG. 5, a continuous active layer 20C may be formed over the continuous bottom gate dielectric layer 10C. In some embodiments, the continuous active layer 20C includes a semiconductor material, an oxide semiconductor material or a semiconducting metal oxide material. In some embodiments, the continuous active layer 20C includes at least one element selected from the group consisting In, Ga, Zn, W, Sn, Cd, Al and O. For example, the continuous active layer 20C includes, indium tungsten oxide (IWO), indium zinc oxide (IZO), indium tungsten zinc oxide (IWZO), indium tin oxide (ITO), indium gallium oxide (IGO), aluminum zinc oxide (AZO), gallium zinc oxide (GZO), gallium oxide (GaO), indium oxide (InO), zinc oxide (ZnO), the like, or a combination thereof, and each of the mentioned materials may be doped or undoped. Other suitable active materials are within the contemplated scope of the present disclosure. In some embodiments, the continuous active layer 20C is a single layer such as an IGZO layer. In other embodiments, the continuous active layer 20C has a multi-layer structure. For example, the continuous active layer 20C includes, from bottom to top, an IGZO layer and an InO layer. For example, the continuous active layer 20C includes, from bottom to top, a GZO layer and an InO layer. For example, the continuous active layer 20C includes, from bottom to top, an IGZO layer and an IZO layer. For example, the continuous active layer 20C includes, from bottom to top, an IGZO layer and an IGO layer. For example, the continuous active layer 20C includes, from bottom to top, an InO layer, a GaO layer, a ZnO layer, a GaO layer and an InO layer. Other suitable semiconducting materials are within the contemplated scope of disclosure. The continuous active layer 20C is referred to as a "first oxide semiconductor layer" or "channel layer" in some examples. In some embodiments, the method of forming the continuous active layer 20C includes performing a suitable deposition process, such as a physical vapor deposition (PVD) process, a chemical vapor deposition (CVD) process, a plasma enhanced CVD (PECVD) process, an atomic layer deposition (ALD), or the like. The thickness of the continuous active layer 20C may be in a range from about 1 nm to 100 nm, such as from 2 nm to 50 nm or from 4 nm to 15 nm, although lesser and greater thicknesses may also be used.

Figure 6:
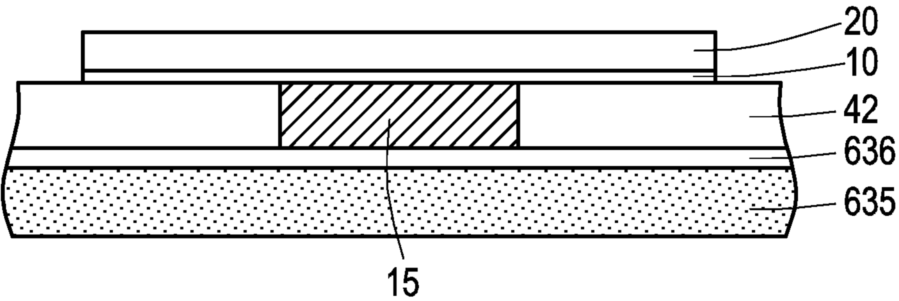

Referring to FIG. 6, the continuous active layer 20C and the continuous bottom gate dielectric layer 10C are patterned to form a bottom gate dielectric layer 10 and an active layer 20 sequentially stacked on the insulating layer 42 and the bottom gate electrode 15. The patterning process includes performing photolithography and etching processes. In some embodiment, a film stack including the bottom gate electrode 15, the bottom gate dielectric layer 10, and the active layer 20 may be formed over lower-level dielectric layers (601, 610, 620) that overlies the substrate 8. The film stack may have substantially straight sidewalls or inclined sidewalls.

Figure 7:
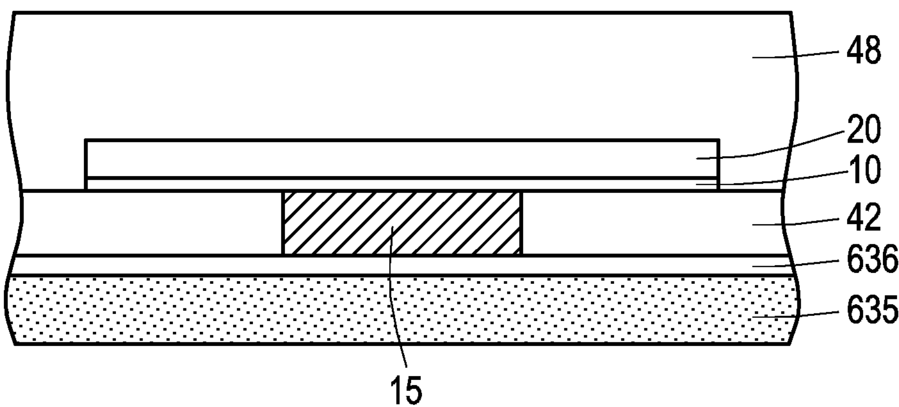

Referring to FIG. 7, a dielectric layer 48 may be formed over the insulating layer 42, covering the bottom gate dielectric layer 10 and the active layer 20. The dielectric layer is referred to as an "electrode-level dielectric layer" in some examples. In some embodiments, the dielectric layer 48 may include, but is not limited to, silicon oxide, silicon nitride, silicon oxynitride, a dielectric metal oxide (such as aluminum oxide, hafnium oxide, yttrium oxide, lanthanum oxide, etc.), or a stack thereof. In some embodiments, the dielectric layer 48 includes a dielectric material such as undoped silicate glass, a doped silicate glass, organosilicate glass, or a stack thereof. Other suitable dielectric materials are within the contemplated scope of disclosure. In some embodiments, the method of forming the dielectric layer 48 includes performing a suitable deposition process, such as a physical vapor deposition (PVD) process, a chemical vapor deposition (CVD) process, a plasma enhanced CVD (PECVD) process, an atomic layer deposition (ALD), or the like. Optionally, the dielectric layer 48 may be planarized to provide a flat top surface.

Figure 8:
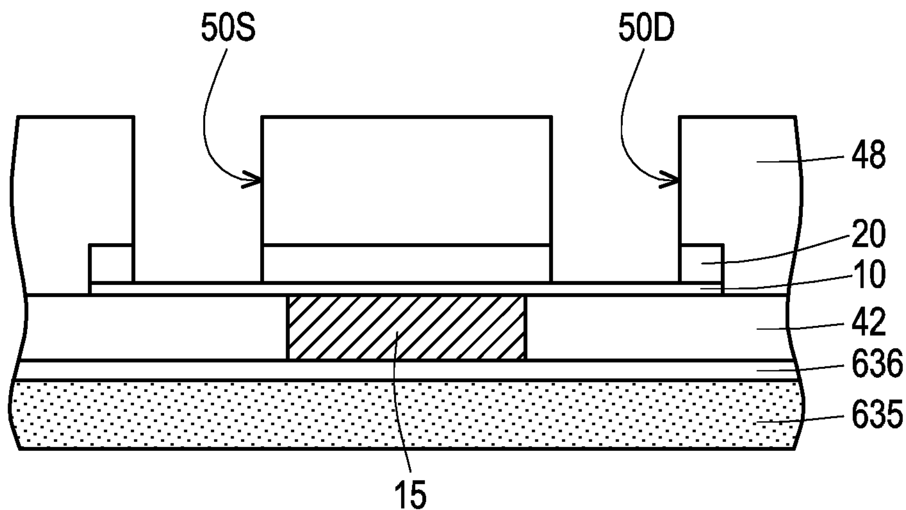

Referring to FIG. 8, the dielectric layer 48 and the active layer 20 are patterned to form a source cavity 50S and a drain cavity 50D separated from each other. In some embodiments, the patterning process includes photolithography and etching processes. The source cavity 50S and the drain cavity 50D may be formed at opposite ends of the active layer 20, and may be laterally spaced from each other by a distance. In some embodiments, opposite end sidewalls of the active layer 20 laterally extend outwardly from the sidewall of the source cavity 50S and the sidewall of the drain cavity 50D, respectively. In some embodiments, the sidewall of the source cavity 50S exposes a portion of the dielectric layer 48 and a portion of the active layer 20, and the bottom of the source cavity 50S exposes a portion of the bottom gate dielectric layer 10. In some embodiments, the sidewall of the drain cavity 50D exposes another portion of the dielectric layer 48 and another portion of the active layer 20, and the bottom of the drain cavity 50D exposes another portion of the bottom gate dielectric layer 10. The source cavity 50S and the drain cavity 50D may have substantially straight sidewalls or inclined sidewalls.

Figure 9:
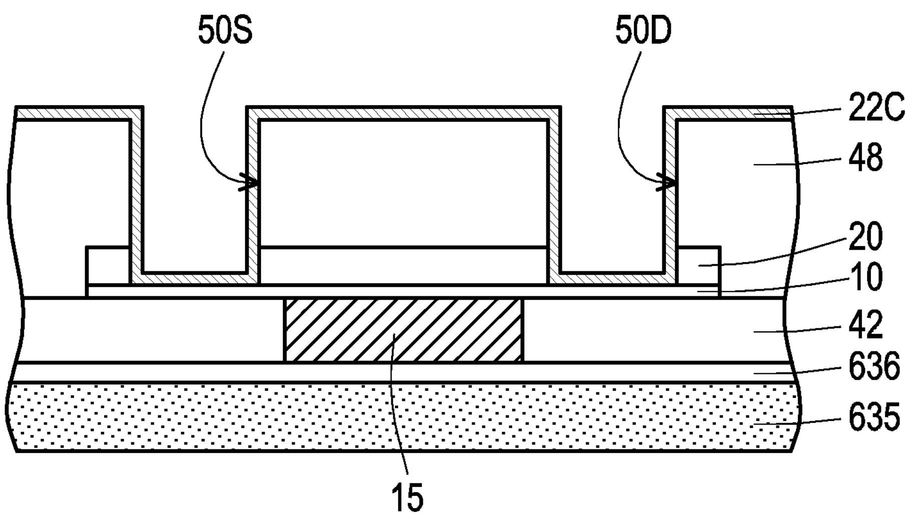

Referring to FIG. 9, a continuous interfacial layer 22C is conformally formed on sidewalls and bottoms of the source cavity 50S and the drain cavity 50D. The material of the continuous interfacial layer 22C may be selected to avoid the interaction between the subsequently formed material (e.g., oxide semiconductor) with the material (e.g., metal oxide) included in the bottom gate electric layer 10. In some embodiments, the continuous interfacial layer 22C includes TiN, WCN, W, TaN, Ru, Al, InO, IZO, ITO, the like, or a combination thereof. Other suitable interfacial materials are within the contemplated scope of the present disclosure. In some embodiments, the method of forming the continuous interfacial layer 22C includes performing a suitable deposition process, such as a physical vapor deposition (PVD) process, a chemical vapor deposition (CVD) process, a plasma enhanced CVD (PECVD) process, an atomic layer deposition (ALD), or the like. The thickness of the continuous interfacial layer 22C may be in a range from about 1 angstrom to 30 angstroms, such as from 5 angstroms to 25 angstroms or from 10 angstroms to 20 angstroms, although lesser and greater thicknesses may also be used. In some embodiments, the continuous interfacial layer 22C is formed thicker on the bottoms of the source cavity 50S and the drain cavity 50D while thinner on the sidewalls of the source cavity 50S and the drain cavity 50D. In some embodiments, the continuous interfacial layer 22C is formed with a substantially uniform thickness.

Figure 10:
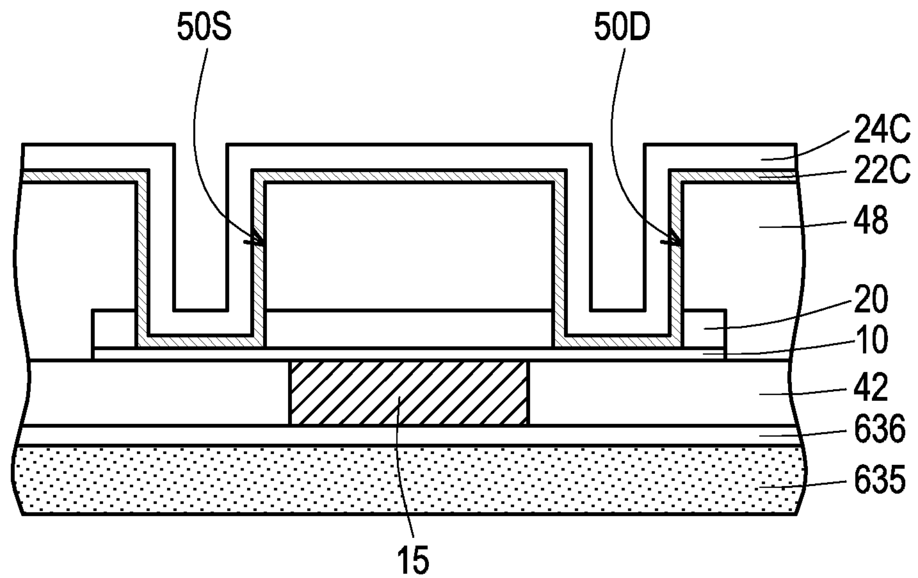

Referring to FIG. 10, a continuous buffer layer 24C may be formed over the continuous interfacial layer 22C in the source cavity 50S and the drain cavity 50D. In some embodiments, the continuous buffer layer 24C is in direct contact with the continuous interfacial layer 22C. The material of the continuous buffer layer 24C may be selected to improve the contact resistance between the subsequently formed material (e.g., metal) and the material (e.g., oxide semiconductor) included in the active layer 20. In some embodiments, the continuous buffer layer 24C includes a semiconductor material, an oxide semiconductor material or a semiconducting metal oxide material. In some embodiments, the continuous buffer layer 24C includes at least one element selected from the group consisting In, Ga, Zn, W, Sn, Cd, Al and O. For example, the continuous buffer layer 24C includes, indium tungsten oxide (IWO), indium zinc oxide (IZO), indium tungsten zinc oxide (IWZO), indium tin oxide (ITO), indium gallium oxide (IGO), aluminum zinc oxide (AZO), gallium zinc oxide (GZO), gallium oxide (GaO), indium oxide (InO), zinc oxide (ZnO), the like, or a combination thereof, and each of the mentioned materials may be doped or undoped. Other suitable semiconducting materials are within the contemplated scope of disclosure. The continuous buffer layer 24C is referred to as a "second oxide semiconductor layer" in some examples. In some embodiments, the method of forming the continuous buffer layer 24C includes performing a suitable deposition process, such as a physical vapor deposition (PVD) process, a chemical vapor deposition (CVD) process, a plasma enhanced CVD (PECVD) process, an atomic layer deposition (ALD), or the like. The thickness of the continuous buffer layer 24C may be less than about 30 nm, such as from 1 nm to 25 nm, from 5 nm to 20 nm, or from 10 nm to 15 nm, although lesser and greater thicknesses may also be used. The thickness ratio of the continuous buffer layer 24C to the continuous interfacial liner 22D ranges from about 300:1 to 10:1, such as from 100:1 to 50:1, although other thickness ratios may also be used. In some embodiments, the continuous buffer layer 24C and the active layer 20 include the same material but different conductivities. The continuous buffer layer 24C may be more conductive than the active layer 20. For example, the carrier density of the continuous buffer layer 24C. In some embodiments, the active layer 20 has a carrier density ranging from about $1\times10^{14}/cm^3$ to $1\times10^{18}/cm^3$, and the continuous buffer layer 24C has a carrier density of about $1\times10^{19}/cm^3$ or more.

Figure 11:
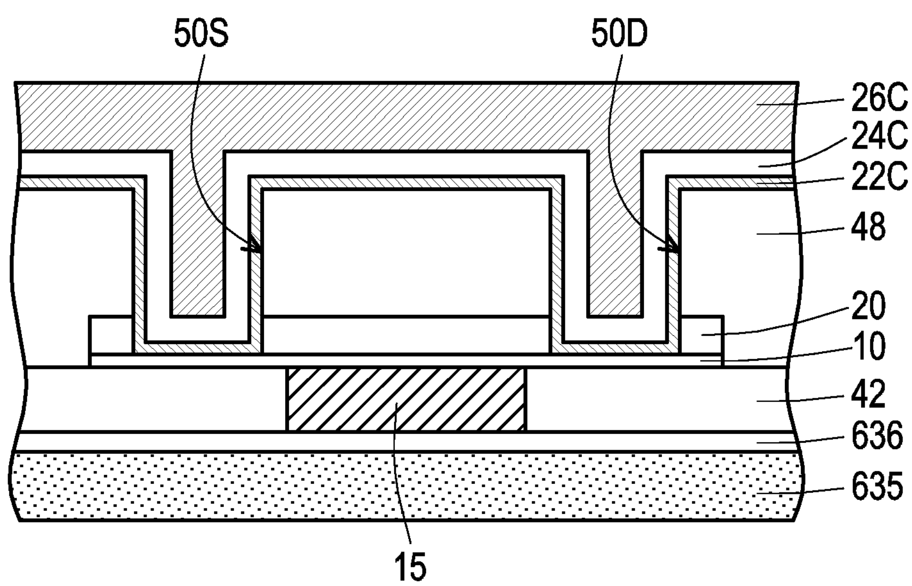

Referring to FIG. 11, a continuous metal fill layer 26C may be formed over the continuous buffer layer 24C in the source cavity 50S and the drain cavity 50D. At least one conductive material may be deposited in the source cavity 50S and the drain cavity 50D and over the TFT-level dielectric layer 40. The at least one conductive material may include W, Cu, Al, Co, Ru, Mo, Ta, Ti, an alloy thereof, or a combination thereof. Other suitable materials within the contemplated scope of disclosure may also be used. In some embodiments, the continuous metal fill layer 26C is in direct contact with the continuous buffer layer 24C.

Figure 12:
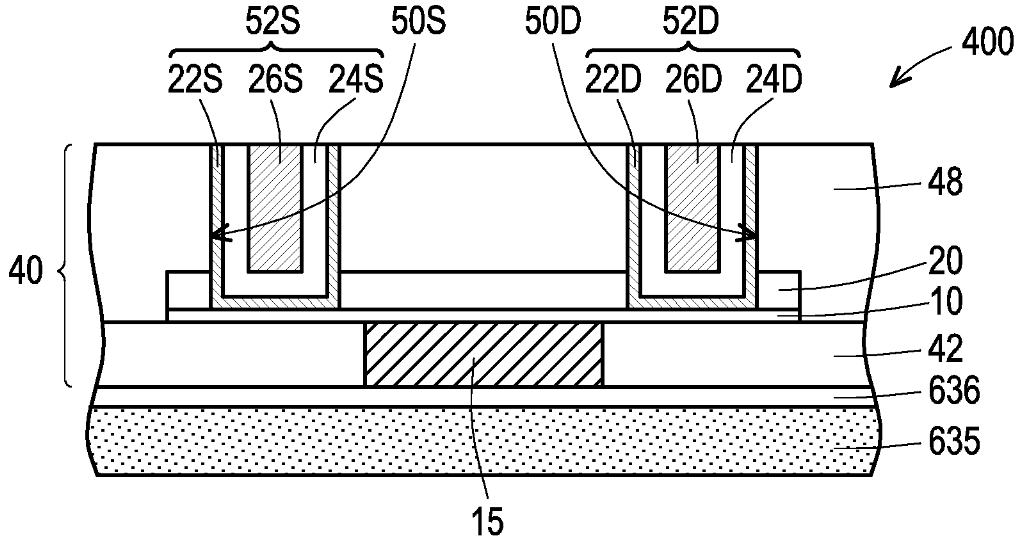

Referring to FIG. 12, the continuous interfacial layer 22C, the continuous buffer layer 24C and the continuous metal fill layer 26C outside of the source cavity 50S and the drain cavity 50D are removed from the top surface of the TFT-level dielectric layer 40 by a planarization process, which may use a CMP process and/or a recess etch process. Other suitable planarization processes may be used. The remaining portions of the layers in the source cavity 50S constitute a source electrode 52S. The remaining portions of the layers in the drain cavity 50D constitute a drain electrode 52D.

In some embodiments, the source electrode 52S may include an interfacial liner 22S, a buffer layer 24S and a metal fill layer 26S. In some embodiments, the drain electrode 52D may include an interfacial liner 22D, a buffer layer 24D and a metal fill layer 26D. The bottom gate electrode 15, the bottom gate electric layer 10, the active layer 20 and a set of the source electrode 52S and the drain electrode 52D constitute a TFT device 400 within a TFT-level dielectric layer 40, and the interfacial layer 22S/22D is provided between the active layer 20 and the bottom gate electric layer 10 for avoiding the undesired interaction between the active layer 20 and the bottom gate electric layer 10. Top surfaces of the source electrode 52S, the drain electrode 52D may be located within (i.e., may be co-planar with) a horizontal plane including a top surface of the TFT-level dielectric layer 40. In some embodiments, the source electrode 52S and the drain electrode 52D may be formed through the dielectric layer 24 and the active layer 20 and directly landed on end portions of the bottom gate dielectric layer 10.

Figure 13:
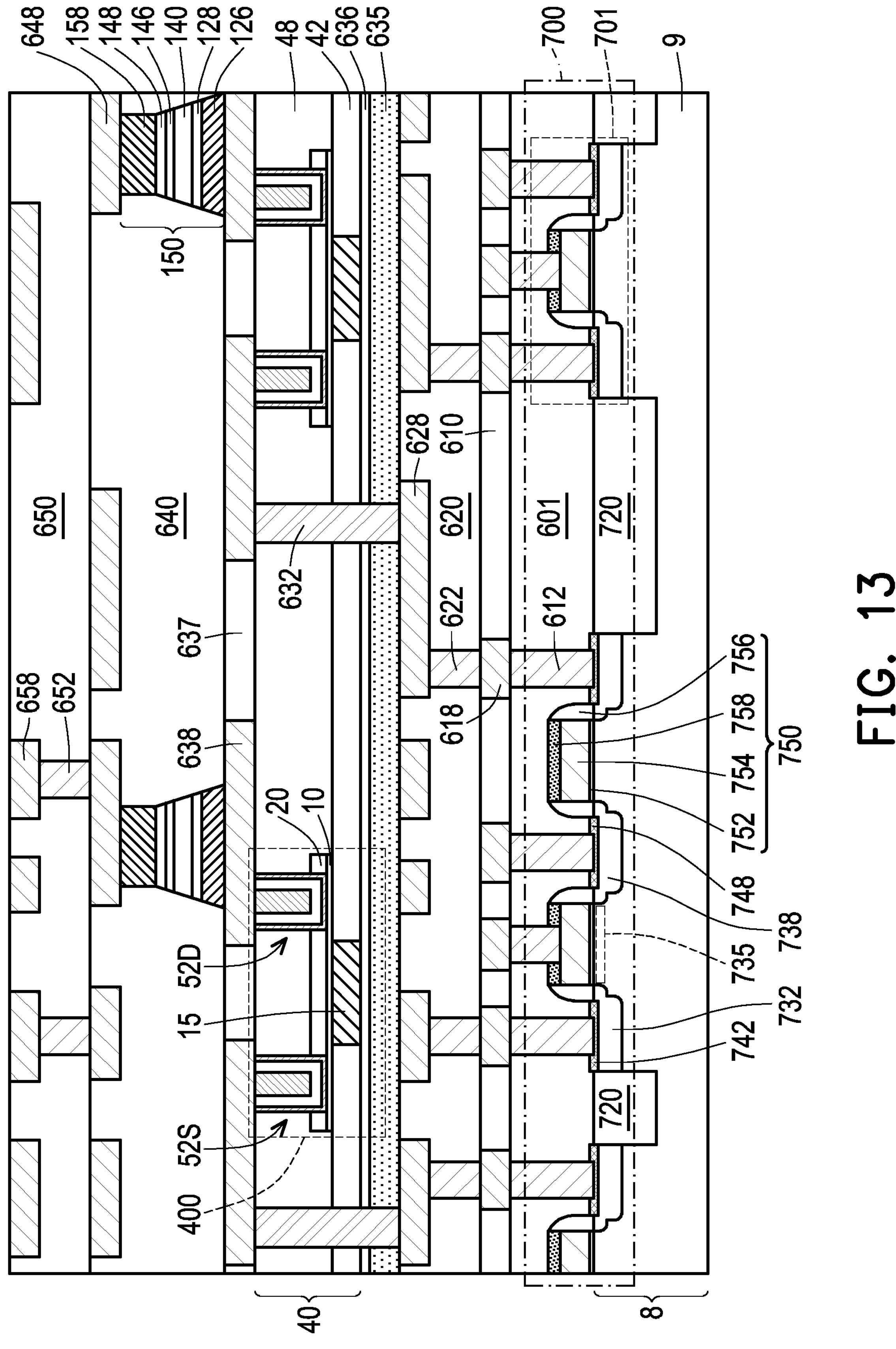

Referring to FIG. 13, an exemplary structure is illustrated after formation of the at least one thin film transistor. In some embodiments, second metal vias 632 may be formed may be formed through the TFT-level dielectric layer 40 and the insulating layer 635 on a respective one of the second metal lines 628 before or after formation of the source electrodes 52S and the drain electrodes 52D.

A dielectric layer, which is herein referred to as a third line-level dielectric layer 637, may be deposited over the TFT-level dielectric layer 40. Third metal lines 638 may be formed in the third line-level dielectric layer 637 on a respective one of the metallic structures (52S, 52D) embedded within the TFT-level dielectric layer 40.

Additional metal interconnect features embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect features may include third metal vias (not illustrated) and fourth metal lines 648 embedded in the fourth interconnect-level dielectric layer 640, fourth metal vias 652 and fifth metal lines 658 embedded in the fifth interconnect-level dielectric layer 650, etc.

Optionally, memory cells 150 may be formed below, above, or at the same level as, the thin film transistors. In embodiments in which the thin film transistors are formed as a two-dimensional periodic array, the memory cells 150 may be formed as a two-dimensional periodic array of memory cells 150. Each memory cell 150 may include a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., bottom electrode) and the second electrode 158 (i.e., top electrode).

In an illustrative example, in embodiments in which the memory cell 150 includes a magnetic tunnel junction, and the memory cell 150 may include a layer stack including, from bottom to top, a first electrode 126, a metallic seed layer 128 that facilitates crystalline growth of overlying material layers, a synthetic antiferromagnet (SAF) structure 140, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In some embodiments, the substrate 8 includes a single crystalline silicon substrate. Lower-level dielectric layers (601, 610, 620) embedding lower-level metal interconnect features (612, 618, 622, 628) may be located between the single crystalline silicon substrate and the insulating layer 42. Field effect transistors 701 including a respective portion of the single crystalline silicon substrate as a channel may be embedded within the lower-level dielectric layers (601, 610, 620), and may be electrically connected to at least one of the gate electrodes 15, the source electrodes 52S, and the drain electrodes 52D.

In the present disclosure, a very thin interfacial layer 22S/22D is disposed between the bottom gate electric layer 10 and each of the buffer layer 24S/24D and the active layer 20, so as to prevent the interaction between materials included in these layers and therefore improve the ferroelectric device performance.

The above embodiments in which the very thin interfacial layer as a ferroelectricity enhancing element is formed after the source and drain cavities are defined. However, the present disclosure is not limited thereto. Such ferroelectricity enhancing element may be formed before the source and drain cavities are defined. FIGS. 14 to 22 illustrate a local region which corresponds to an area in which a TFT device 401 is to be subsequently formed. The TFT device 401 of FIG. 22 is similar to the TFT device 400 of FIG. 12, so the difference between them is described in details below, and the similarity is not iterated herein. The TFT device 401 may replace the TFT device 400 and apply to the structure as shown in FIG. 13.

Figure 14:
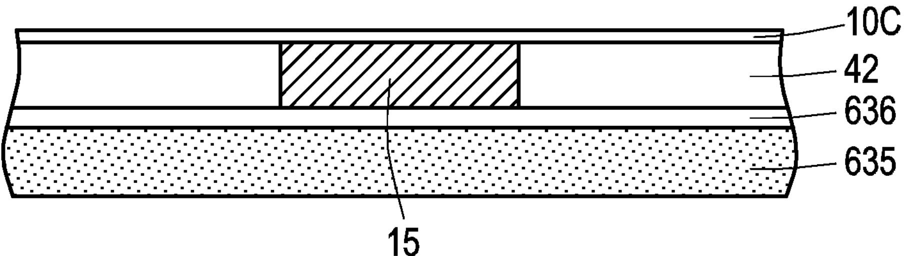
FIG. 14 to FIG. 22 illustrate cross-sectional views of a method of forming a semiconductor device in accordance with some embodiments of the present disclosure.

Referring to FIG. 14, a bottom gate electrode 15 may be formed within an insulating layer 42 that overlies an optional etch stop dielectric layer 636 or an insulating layer 635 (in embodiments in which the etch stop dielectric layer 636 is not used). Thereafter, a continuous bottom gate dielectric layer 10C may be formed over the bottom gate electrode 15 and the insulating layer 42.

Figure 15:
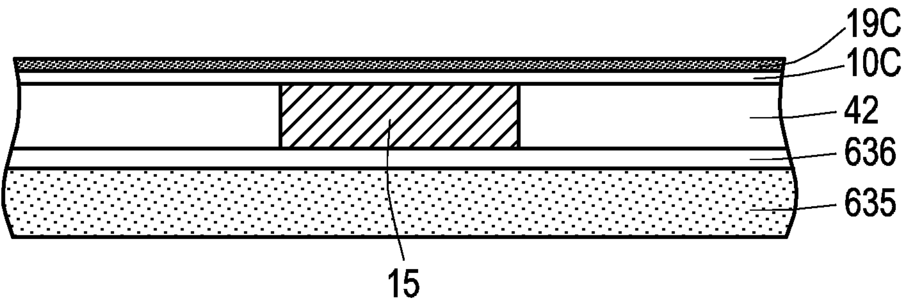

Referring to FIG. 15, a continuous blocking layer 19C may be formed on the continuous bottom gate dielectric layer 10C. The material of the continuous blocking layer 19C may be selected to avoid the interaction between the subsequently formed material (e.g., oxide semiconductor included in the continuous active layer) with the material (e.g., oxide semiconductor) included in the bottom electrode layer 10. The blocking layer is referred to as a "diffusion barrier layer" or "diffusion blocking layer" in some examples. In some embodiments, the continuous blocking layer 19C includes hafnium oxide ($HfO_2$), zirconium oxide ($ZrO_2$), gallium oxide (GaO), tungsten oxide ($WO_2$), aluminum oxide ($Al_2O_3$), silicon oxide ($SiO_2$), the like or a combination thereof. Other suitable blocking materials are within the contemplated scope of the present disclosure. In some embodiments, the method of forming the continuous blocking layer 19C includes performing a suitable deposition process, such as a physical vapor deposition (PVD) process, a chemical vapor deposition (CVD) process, a plasma enhanced CVD (PECVD) process, an atomic layer deposition (ALD), or the like. In some embodiments, the thickness of the continuous blocking layer 19C may be in a range from about 1 angstrom to 30 angstroms, such as from 5 angstroms to 25 angstroms or from 10 angstroms to 20 angstroms, although lesser and greater thicknesses may also be used. In some embodiments, the continuous blocking layer 19C is formed with a substantially uniform thickness. In some embodiments, the continuous blocking layer 19C has a substantially planar top surface and a substantially planar bottom surface.

Figure 16:
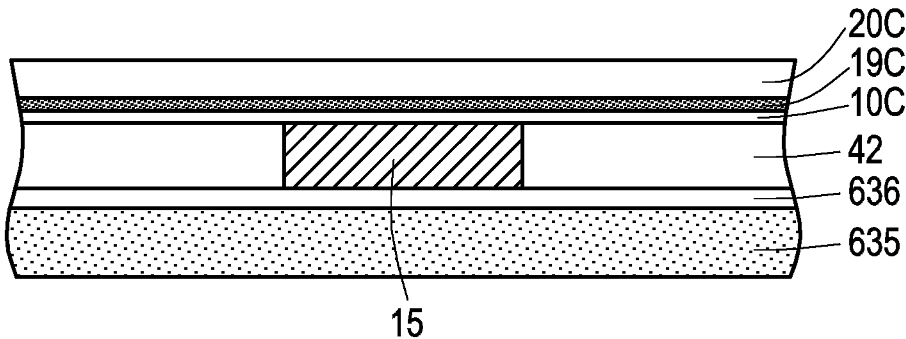

Referring to FIG. 16, a continuous active layer 20C may be formed over the continuous blocking layer 19C. In some embodiments, the continuous blocking layer 19C and the continuous active layer 20C are formed with different materials. Specifically, the material of the continuous blocking layer 19C is selected to provide effective diffusion blocking for the metallic elements within the continuous active layer 20C.

Figure 17:
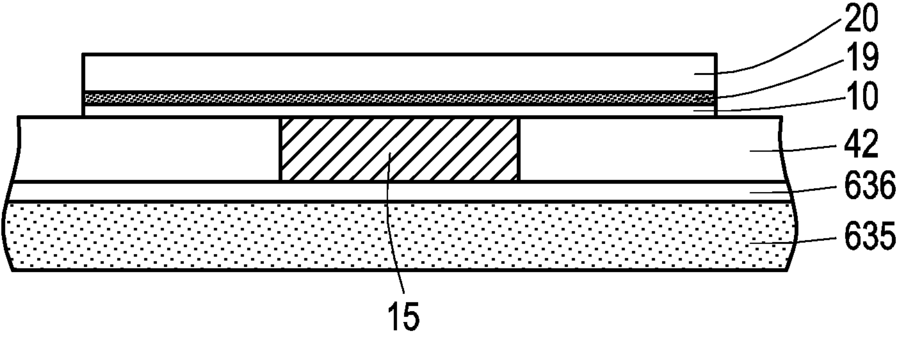

Referring to FIG. 17, the continuous active layer 20C, the continuous blocking layer 19C and the continuous bottom gate dielectric layer 10C are patterned to form a bottom gate dielectric layer 10, a blocking layer 19 and an active layer 20 sequentially stacked on the bottom gate electrode 15 and the insulating layer 42. The patterning process includes performing photolithography and etching processes. In some embodiment, a film stack including the bottom gate electrode 15, the bottom gate dielectric layer 10, the blocking layer 19 and the active layer 20 may be formed over lower-level dielectric layers (601, 610, 620) that overlies the substrate 8. The film stack may have substantially straight sidewalls or inclined sidewalls.

Figure 18:
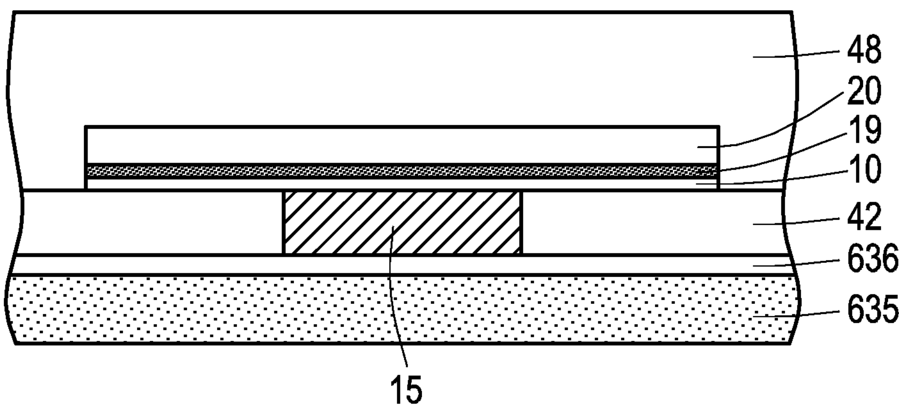

Referring to FIG. 18, a dielectric layer 48 may be formed over the insulating layer 42, covering the bottom gate dielectric layer 10, the blocking layer 19 and the active layer 20.

Figure 19:
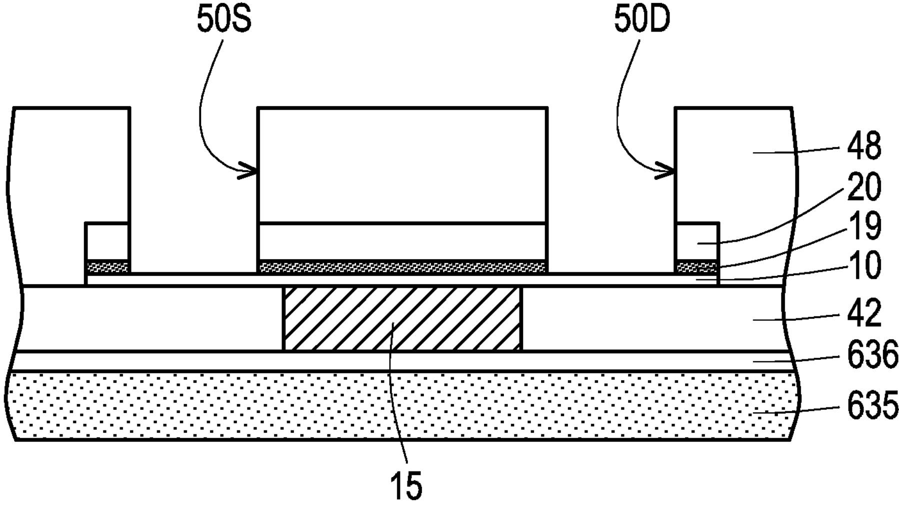

Referring to FIG. 19, the dielectric layer 48, the active layer 20 and the blocking layer 19 are patterned to form a source cavity 50S and a drain cavity 50D separated from each other. In some embodiments, the patterning process includes photolithography and etching processes. The source cavity 50S and the drain cavity 50D may be formed at opposite ends of the active layer 20, and may be laterally spaced from each other by a distance. In some embodiments, opposite end sidewalls of the active layer 20 laterally extend outwardly from the sidewall of the source cavity 50S and the sidewall of the drain cavity 50D, respectively. In some embodiments, the sidewall of the source cavity 50S exposes a portion of the dielectric layer 48, a portion of the active layer 20 and a portion of the blocking layer 19, and the bottom of the source cavity 50S exposes a portion of the bottom gate dielectric layer 10. In some embodiments, the sidewall of the drain cavity 50D exposes another portion of the dielectric layer 48, another portion of the active layer 20 and another portion of the blocking layer 19, and the bottom of the drain cavity 50D exposes another portion of the bottom gate dielectric layer 10. The source cavity 50S and the drain cavity 50D may have substantially straight sidewalls or inclined sidewalls.

Figure 20:
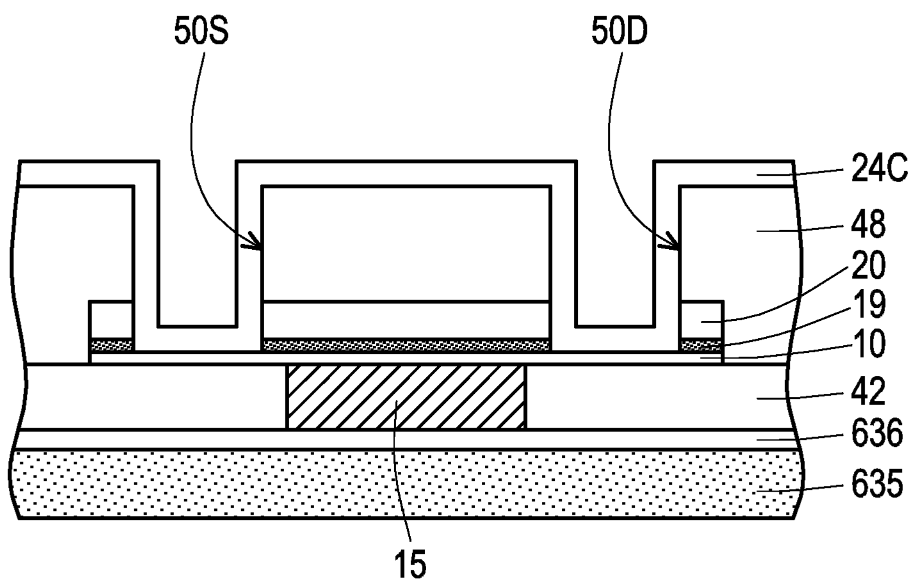

Referring to FIG. 20, a continuous buffer layer 24C is conformally formed in the source cavity 50S and the drain cavity 50D. In some embodiments, the continuous buffer layer 24C is in direct contact with the dielectric layer 48, the active layer 20, the blocking layer 19, and the bottom gate dielectric layer 10. The material of the continuous buffer layer 24C may be selected to improve the contact resistance between the subsequently formed material (e.g., metal) and the material (e.g., oxide semiconductor) included in the active layer 20. In some embodiments, the continuous buffer layer 24C includes a semiconductor material, an oxide semiconductor material or a semiconducting metal oxide material. In some embodiments, the continuous buffer layer 24C includes at least one element selected from the group consisting In, Ga, Zn, W, Sn, Cd, Al and O. For example, the continuous buffer layer 24C includes, indium tungsten oxide (IWO), indium zinc oxide (IZO), indium tungsten zinc oxide (IWZO), indium tin oxide (ITO), indium gallium oxide (IGO), aluminum zinc oxide (AZO), gallium zinc oxide (GZO), gallium oxide (GaO), indium oxide (InO), zinc oxide (ZnO), the like, or a combination thereof, and each of the mentioned materials may be doped or undoped. Other suitable semiconducting materials are within the contemplated scope of disclosure. The continuous buffer layer 24C is referred to as a "second oxide semiconductor layer" in some examples. In some embodiments, the method of forming the continuous buffer layer 24C includes performing a suitable deposition process, such as a physical vapor deposition (PVD) process, a chemical vapor deposition (CVD) process, a plasma enhanced CVD (PECVD) process, an atomic layer deposition (ALD), or the like. The thickness of the continuous buffer layer 24C may be less than about 30 nm, such as from 1 nm to 25 nm, from 5 nm to 20 nm, or from 10 nm to 15 nm, although lesser and greater thicknesses may also be used. In some embodiments, the continuous buffer layer 24C and the active layer 20 include the same material but different conductivities. The continuous buffer layer 24C may be more conductive than the active layer 20. For example, the carrier density of the continuous buffer layer 24C. In some embodiments, the active layer 20 has a carrier density ranging from about $1\times10^{14}/cm^3$ to $1\times10^{18}/cm^3$, and the continuous buffer layer 24C has a carrier density of about $1\times10^{19}/cm^3$ or more.

Figure 21:
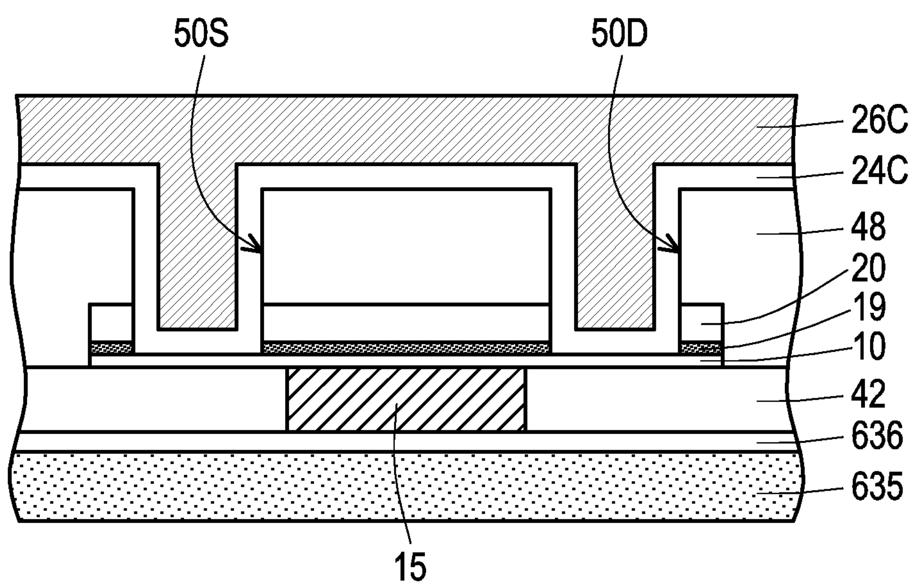
Figure 22:
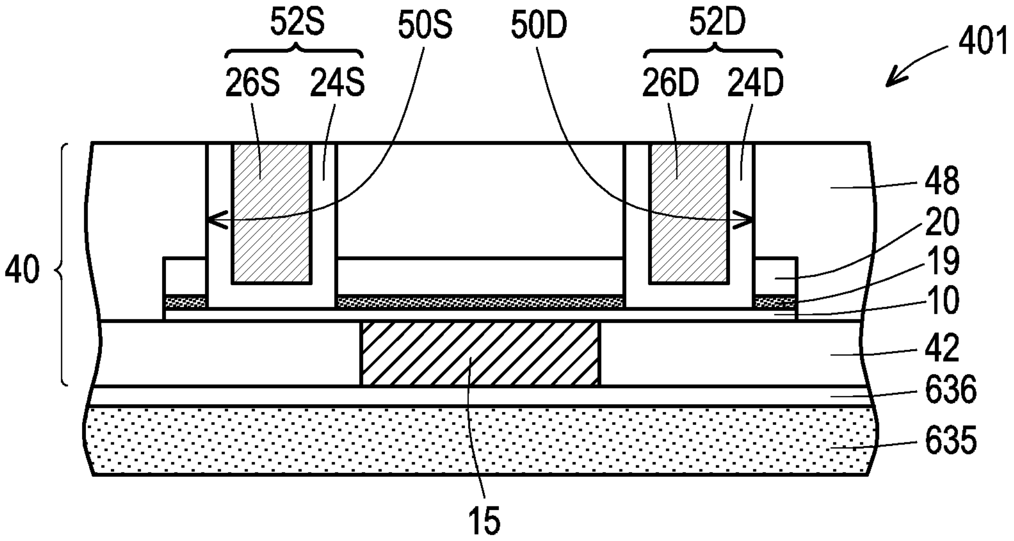

Referring to FIG. 21, a continuous metal fill layer 26C may be formed over the continuous buffer layer 24C in the source cavity 50S and the drain cavity 50D. At least one conductive material may be deposited in the source cavity 50S and the drain cavity 50D and over the TFT-level dielectric layer 40. The at least one conductive material may include W, Cu, Al, Co, Ru, Mo, Ta, Ti, an alloy thereof, or a combination thereof. Other suitable materials within the contemplated scope of disclosure may also be used. In some embodiments, the continuous metal fill layer 26C is in direct contact with the continuous buffer layer 24C. In other embodiments, a metallic liner material may be interposed between the continuous metal fill layer 26C and the continuous buffer layer 24C, and the metallic liner material includes a conductive metallic nitride or a conductive metallic carbide such as TiN, TaN, WN, TiC, TaC, WC, the like, or a combination thereof.

Referring to FIG. 22, the continuous interfacial layer 22C, the continuous buffer layer 24C and the continuous metal fill layer 26C outside of the source cavity 50S and the drain cavity 50D are removed from the top surface of the TFT-level dielectric layer 40 by a planarization process, which may use a CMP process and/or a recess etch process. Other suitable planarization processes may be used. The remaining portions of the layers in the source cavity 50S constitute a source electrode 52S. The remaining portions of the layers in the drain cavity 50D constitute a drain electrode 52D.

In some embodiments, the source electrode 52S may include a buffer layer 24S and a metal fill layer 26S. In some embodiments, the drain electrode 52D may include a buffer layer 24D and a metal fill layer 26D. The bottom gate electrode 15, the bottom gate electric layer 10, the active layer 20 and a set of the source electrode 52S and the drain electrode 52D constitute a TFT device 401 within a TFT-level dielectric layer 40, and the blocking layer 19 is provided between the active layer 20 and the bottom gate electric layer 10 for avoiding the undesired interaction between the active layer 20 and the bottom gate electric layer 10. Top surfaces of the source electrode 52S, the drain electrode 52D may be located within (i.e., may be co-planar with) a horizontal plane including a top surface of the TFT-level dielectric layer 40. In some embodiments, the source electrode 52S and the drain electrode 52D may be formed through the dielectric layer 24, the active layer 20 and the blocking layer 19 and directly landed on end portions of the bottom gate dielectric layer 10.

In the above embodiment, the very thin blocking layer as a ferroelectricity enhancing element may be formed by a deposition process. However, the present disclosure is not limited thereto. For example, such blocking layer may be formed by a surface treatment. FIGS. 23 to 31 illustrate a local region which corresponds to an area in which a TFT device 402 is to be subsequently formed. The TFT device 402 of FIG. 31 is similar to the TFT device 401 of FIG. 22, so the difference between them is described in details below, and the similarity is not iterated herein. The TFT device 402 may replace the TFT device 400 and apply to the structure as shown in FIG. 13.

Figure 23:
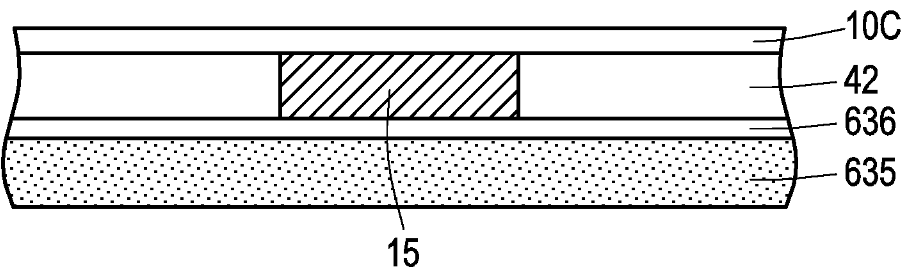
FIG. 23 to FIG. 31 illustrate cross-sectional views of a method of forming a semiconductor device in accordance with some embodiments of the present disclosure.

Referring to FIG. 23, a bottom gate electrode 15 may be formed within an insulating layer 42 that overlies an optional etch stop dielectric layer 636 or an insulating layer 635 (in embodiments in which the etch stop dielectric layer 636 is not used). Thereafter, a continuous bottom gate dielectric layer 10C may be formed over the bottom gate electrode 15 and the insulating layer 42.

Figure 24:
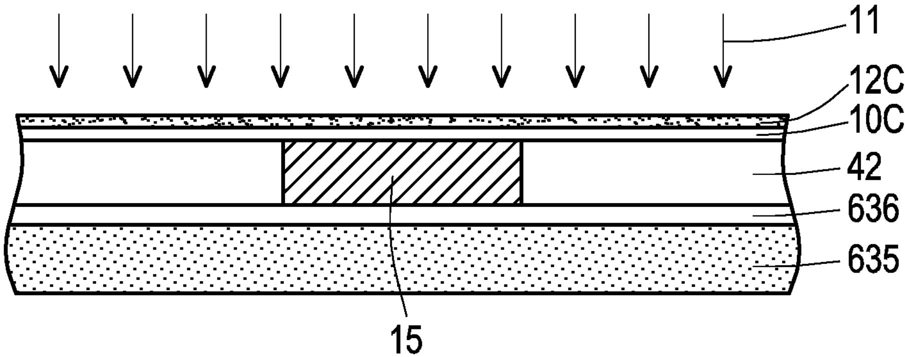

Referring to FIG. 24, a plasma treatment 11 is performed to the continuous bottom gate dielectric layer 10C, so as to form a continuous blocking layer 12C on the top of the continuous bottom gate dielectric layer 10C. In some embodiments, the plasma treatment 11 transforms a top portion of the continuous bottom gate dielectric layer 10C into a continuous blocking layer 12C on the remaining continuous bottom gate dielectric layer 10C. Such transformed material may be selected to avoid the interaction between the subsequently formed material (e.g., oxide semiconductor included in the continuous active layer) with the material (e.g., oxide semiconductor) included in the bottom electrode layer 10. The blocking layer is referred to as a "diffusion barrier layer" or "diffusion blocking layer" in some examples. In some embodiments, the plasma treatment 11 includes a nitrogen-containing plasma, an oxygen-containing plasma or a combination thereof. In some embodiments, the plasma treatment 11 includes ozone, $O_2$, $N_2O$, $NH_3$, $N_2$ or a combination thereof. In some embodiments, the continuous blocking layer 12C has a nitrogen atom content and/or an oxygen atom content of about 10-60 at %, such as 20 at %, 30 at %, 40 at % or 50 at %, including any range between any two of the preceding values. In some embodiments, the continuous blocking layer 12C has a gradient nitrogen and/or oxygen concentration. Specifically, the nitrogen atom content and/or an oxygen atom content of the continuous blocking layer 12C is decreased from the top surface to the bottom surface of the continuous blocking layer 12C. In some embodiments, the thickness of the continuous blocking layer 12C may be in a range from about 1 angstrom to 30 angstroms, such as from 5 angstroms to 25 angstroms or from 10 angstroms to 20 angstroms, although lesser and greater thicknesses may also be used. In some embodiments, the continuous blocking layer 12C is formed with a substantially uniform thickness. In some embodiments, due to the plasma treatment, the top surface and the bottom surface of the continuous blocking layer 12C are rough and uneven.

Figure 25:
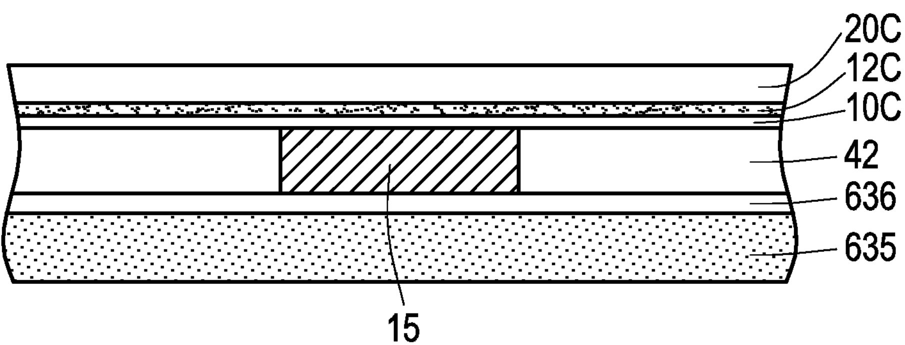

Referring to FIG. 25, a continuous active layer 20C may be formed over the continuous blocking layer 12C. In some embodiments, the continuous blocking layer 12C and the continuous active layer 20C include different materials. For example, the nitrogen atom content and/or oxygen atom content of the continuous blocking layer 12C is greater than the nitrogen atom content and/or oxygen atom content of the continuous bottom gate dielectric layer 10C. Such continuous blocking layer 12C may provide effective diffusion blocking for the metallic elements within the continuous active layer 20C.

Figure 26:
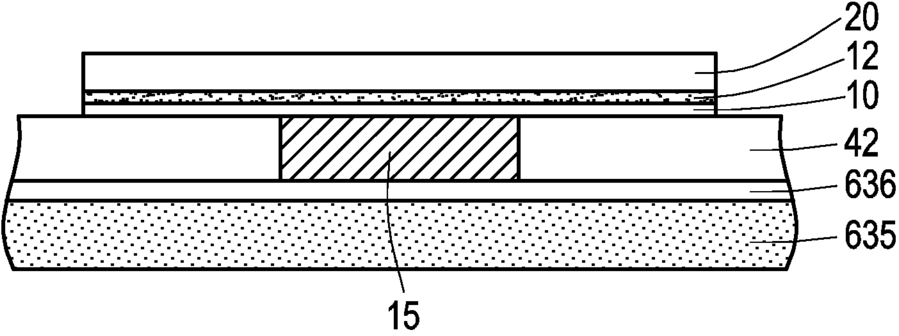

Referring to FIG. 26, the continuous active layer 20C, the continuous blocking layer 12C and the continuous bottom gate dielectric layer 10C are patterned to form a bottom gate dielectric layer 10, a blocking layer 12 and an active layer 20 sequentially stacked on the bottom gate electrode 15 and the insulating layer 42. The patterning process includes performing photolithography and etching processes. In some embodiment, a film stack including the bottom gate electrode 15, the bottom gate dielectric layer 10, the blocking layer 12 and the active layer 20 may be formed over lower-level dielectric layers (601, 610, 620) that overlies the substrate 8. The film stack may have substantially straight sidewalls or inclined sidewalls.

Figure 27:
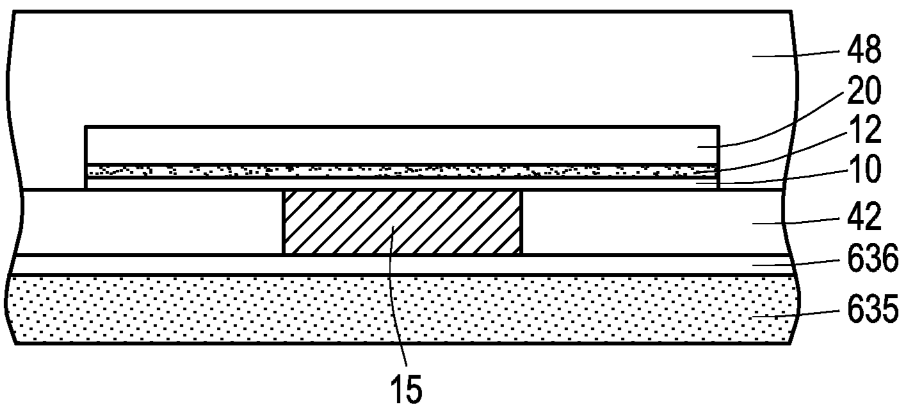

Referring to FIG. 27, a dielectric layer 48 may be formed over the insulating layer 42, covering the bottom gate dielectric layer 10, the blocking layer 12 and the active layer 20.

Figure 28:
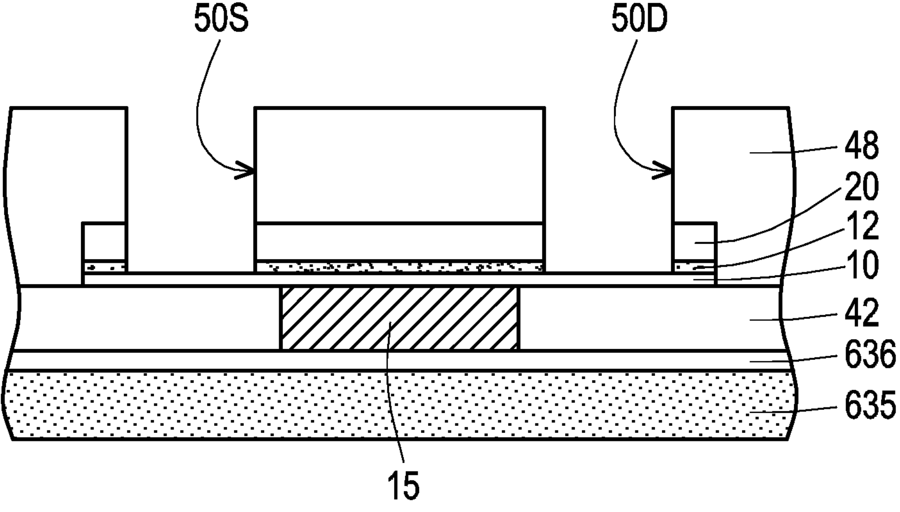

Referring to FIG. 28, the dielectric layer 48, the active layer 20 and the blocking layer 12 are patterned to form a source cavity 50S and a drain cavity 50D separated from each other. In some embodiments, the patterning process includes photolithography and etching processes. The source cavity 50S and the drain cavity 50D may be formed at opposite ends of the active layer 20, and may be laterally spaced from each other by a distance. In some embodiments, opposite end sidewalls of the active layer 20 laterally extend outwardly from the sidewall of the source cavity 50S and the sidewall of the drain cavity 50D, respectively. In some embodiments, the sidewall of the source cavity 50S exposes a portion of the dielectric layer 48, a portion of the active layer 20 and a portion of the blocking layer 12, and the bottom of the source cavity 50S exposes a portion of the bottom gate dielectric layer 10. In some embodiments, the sidewall of the drain cavity 50D exposes another portion of the dielectric layer 48, another portion of the active layer 20 and another portion of the blocking layer 12, and the bottom of the drain cavity 50D exposes another portion of the bottom gate dielectric layer 10. The source cavity 50S and the drain cavity 50D may have substantially straight sidewalls or inclined sidewalls.

Figure 29:
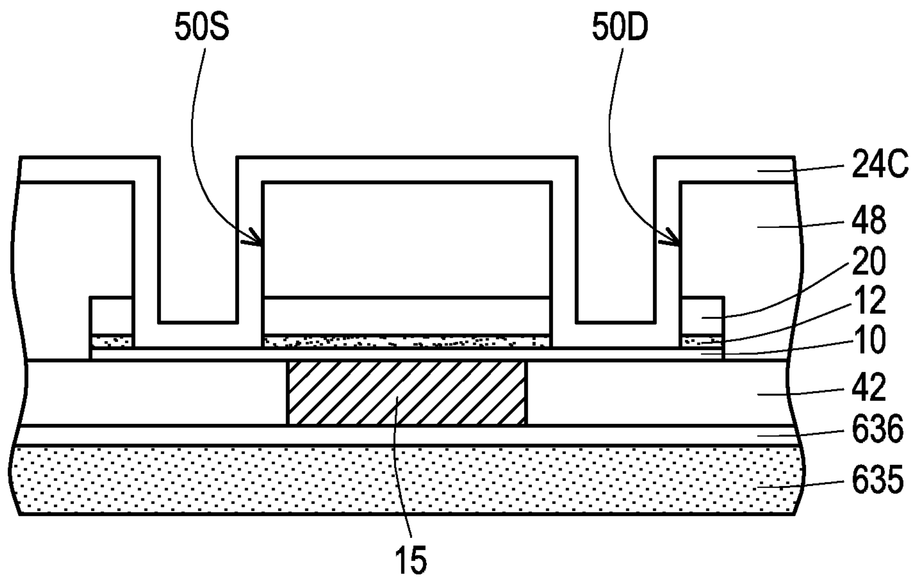

Referring to FIG. 29, a continuous buffer layer 24C is conformally formed in the source cavity 50S and the drain cavity 50D. In some embodiments, the continuous buffer layer 24C is in direct contact with the dielectric layer 48, the active layer 20, the blocking layer 12, and the bottom gate dielectric layer 10. The material of the continuous buffer layer 24C may be selected to improve the contact resistance between the subsequently formed material (e.g., metal) and the material (e.g., oxide semiconductor) included in the active layer 20. In some embodiments, the continuous buffer layer 24C includes a semiconductor material, an oxide semiconductor material or a semiconducting metal oxide material. In some embodiments, the continuous buffer layer 24C includes at least one element selected from the group consisting In, Ga, Zn, W, Sn, Cd, Al and O. For example, the continuous buffer layer 24C includes, indium tungsten oxide (IWO), indium zinc oxide (IZO), indium tungsten zinc oxide (IWZO), indium tin oxide (ITO), indium gallium oxide (IGO), aluminum zine oxide (AZO), gallium zinc oxide (GZO), gallium oxide (GaO), indium oxide (InO), zinc oxide (ZnO), the like, or a combination thereof, and each of the mentioned materials may be doped or undoped. Other suitable semiconducting materials are within the contemplated scope of disclosure. The continuous buffer layer 24C is referred to as a "second oxide semiconductor layer" in some examples. In some embodiments, the method of forming the continuous buffer layer 24C includes performing a suitable deposition process, such as a physical vapor deposition (PVD) process, a chemical vapor deposition (CVD) process, a plasma enhanced CVD (PECVD) process, an atomic layer deposition (ALD), or the like. The thickness of the continuous buffer layer 24C may be less than about 30 nm, such as from 1 nm to 25 nm, from 5 nm to 20 nm, or from 10 nm to 15 nm, although lesser and greater thicknesses may also be used. In some embodiments, the continuous buffer layer 24C and the active layer 20 include the same material but different conductivities. The continuous buffer layer 24C may be more conductive than the active layer 20. For example, the carrier density of the continuous buffer layer 24C. In some embodiments, the active layer 20 has a carrier density ranging from about $1\times10^{14}/cm^3$ to $1\times10^{18}/cm^3$, and the continuous buffer layer 24C has a carrier density of about $1\times10^{19}/cm^3$ or more.

Figure 30:
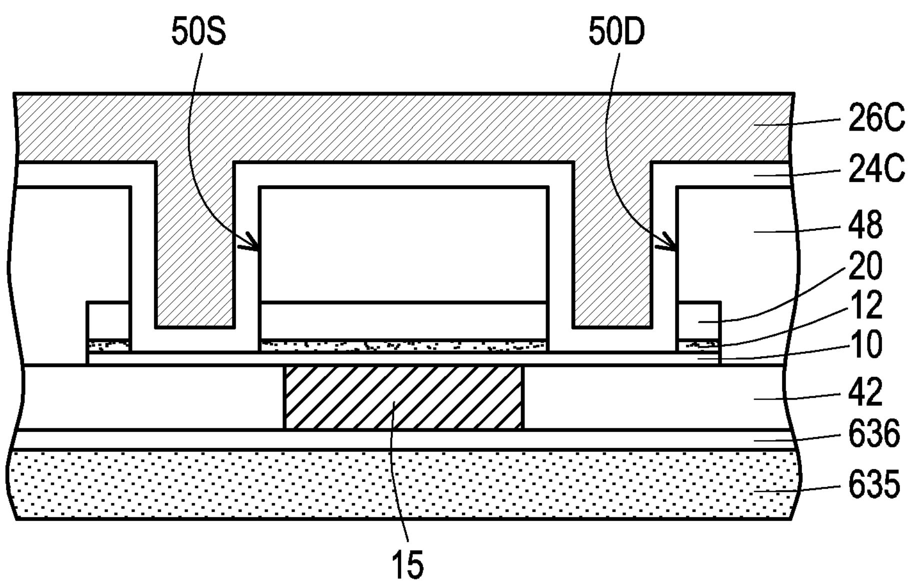
Figure 31:
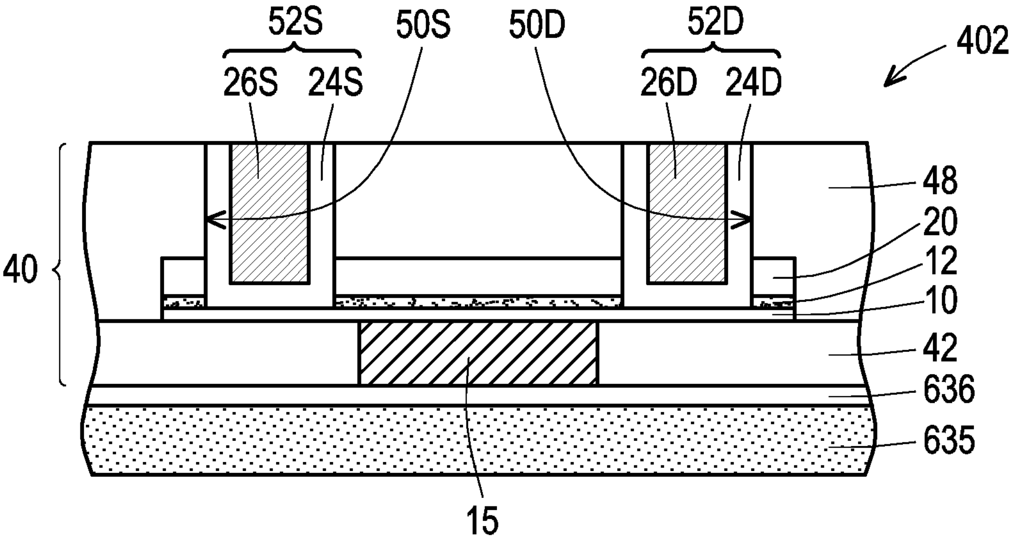

Referring to FIG. 30, a continuous metal fill layer 26C may be formed over the continuous buffer layer 24C in the source cavity 50S and the drain cavity 50D. At least one conductive material may be deposited in the source cavity 50S and the drain cavity 50D and over the TFT-level dielectric layer 40. The at least one conductive material may include W, Cu, Al, Co, Ru, Mo, Ta, Ti, an alloy thereof, or a combination thereof. Other suitable materials within the contemplated scope of disclosure may also be used. In some embodiments, the continuous metal fill layer 26C is in direct contact with the continuous buffer layer 24C. In other embodiments, a metallic liner material may be interposed between the continuous metal fill layer 26C and the continuous buffer layer 24C, and the metallic liner material includes a conductive metallic nitride or a conductive metallic carbide such as TiN, TaN, WN, TiC, TaC, WC, the like, or a combination thereof.

Referring to FIG. 31, the continuous interfacial layer 22C, the continuous buffer layer 24C and the continuous metal fill layer 26C outside of the source cavity 50S and the drain cavity 50D are removed from the top surface of the TFT-level dielectric layer 40 by a planarization process, which may use a CMP process and/or a recess etch process. Other suitable planarization processes may be used. The remaining portions of the layers in the source cavity 50S constitute a source electrode 52S. The remaining portions of the layers in the drain cavity 50D constitute a drain electrode 52D.

In some embodiments, the source electrode 52S may include a buffer layer 24S and a metal fill layer 26S. In some embodiments, the drain electrode 52D may include a buffer layer 24D and a metal fill layer 26D. The bottom gate electrode 15, the bottom gate electric layer 10, the active layer 20 and a set of the source electrode 52S and the drain electrode 52D constitute a TFT device 402 within a TFT-level dielectric layer 40, and the blocking layer 12 is provided between the active layer 20 and the bottom gate electric layer 10 for avoiding the undesired interaction between the active layer 20 and the bottom gate electric layer 10. Top surfaces of the source electrode 52S, the drain electrode 52D may be located within (i.e., may be co-planar with) a horizontal plane including a top surface of the TFT-level dielectric layer 40. In some embodiments, the source electrode 52S and the drain electrode 52D may be formed through the dielectric layer 24, the active layer 20 and the blocking layer 12 and directly landed on end portions of the bottom gate dielectric layer 10.

Figure 32:
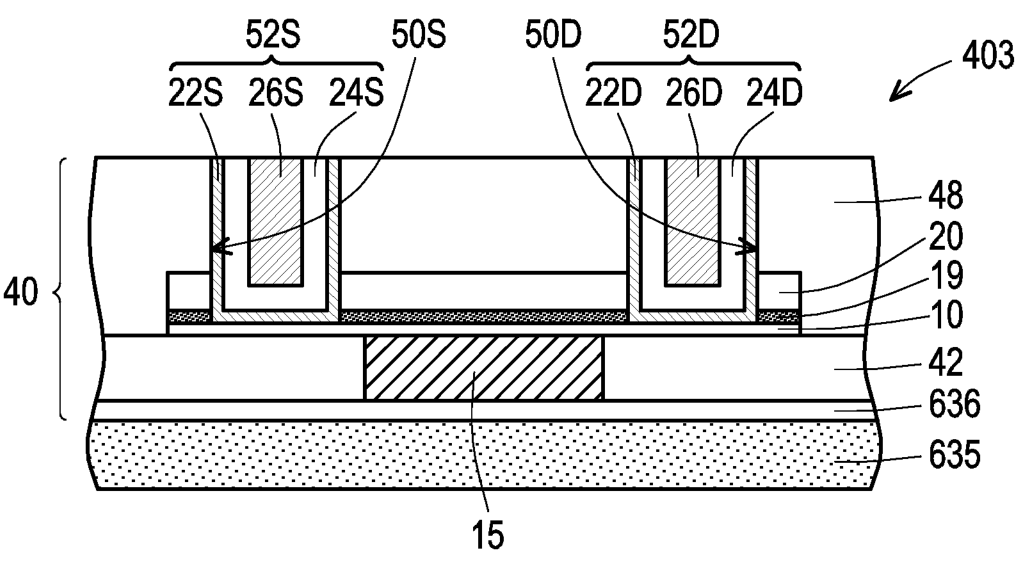
FIG. 32 to FIG. 33 illustrate cross-sectional views of semiconductor devices in accordance with some embodiments of the present disclosure.
Figure 33:
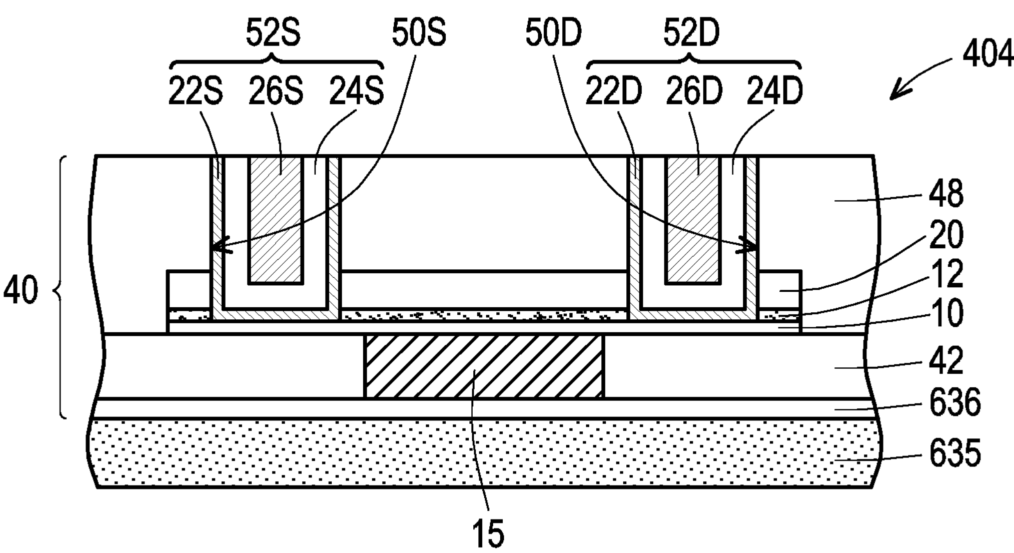

FIG. 32 to FIG. 33 illustrate cross-sectional views of semiconductor devices in accordance with some embodiments of the present disclosure.

The TFT device 403 of FIG. 32 is similar to the TFT device 400 of FIG. 12, so the difference between them is described in details below, and the similarity is not iterated herein. The difference between the TFT device 403 and the TFT device 400 lies in that, the TFT device 403 further includes a blocking layer 19 between the bottom gate dielectric layer 10 and the active layer 20, and the blocking layer 19 is formed by a deposition process. In some embodiments, the interfacial liner 22S/22D is disposed between and in contact with the blocking layer 19 and the buffer layer 24S/24D. The combination of interfacial liner 22S/22D and the blocking layer 19 is beneficial to further avoid the undesired interaction between adjacent layers and according improve the ferroelectric device performance. The TFT device 403 may replace the TFT device 400 and apply to the structure as shown in FIG. 13.

The TFT device 404 of FIG. 33 is similar to the TFT device 400 of FIG. 12, so the difference between them is described in details below, and the similarity is not iterated herein. The difference between the TFT device 404 and the TFT device 400 lies in that, the TFT device 403 further includes a blocking layer 12 between the bottom gate dielectric layer 10 and the active layer 20, and the blocking layer 12 is formed by a surface plasma process. In some embodiments, the interfacial liner 22S/22D is disposed between and in contact with the blocking layer 12 and the buffer layer 24S/24D. The combination of interfacial liner 22S/22D and the blocking layer 12 is beneficial to further avoid the undesired interaction between adjacent layers and according improve the ferroelectric device performance. The TFT device 404 may replace the TFT device 400 and apply to the structure as shown in FIG. 13.

Figure 34:
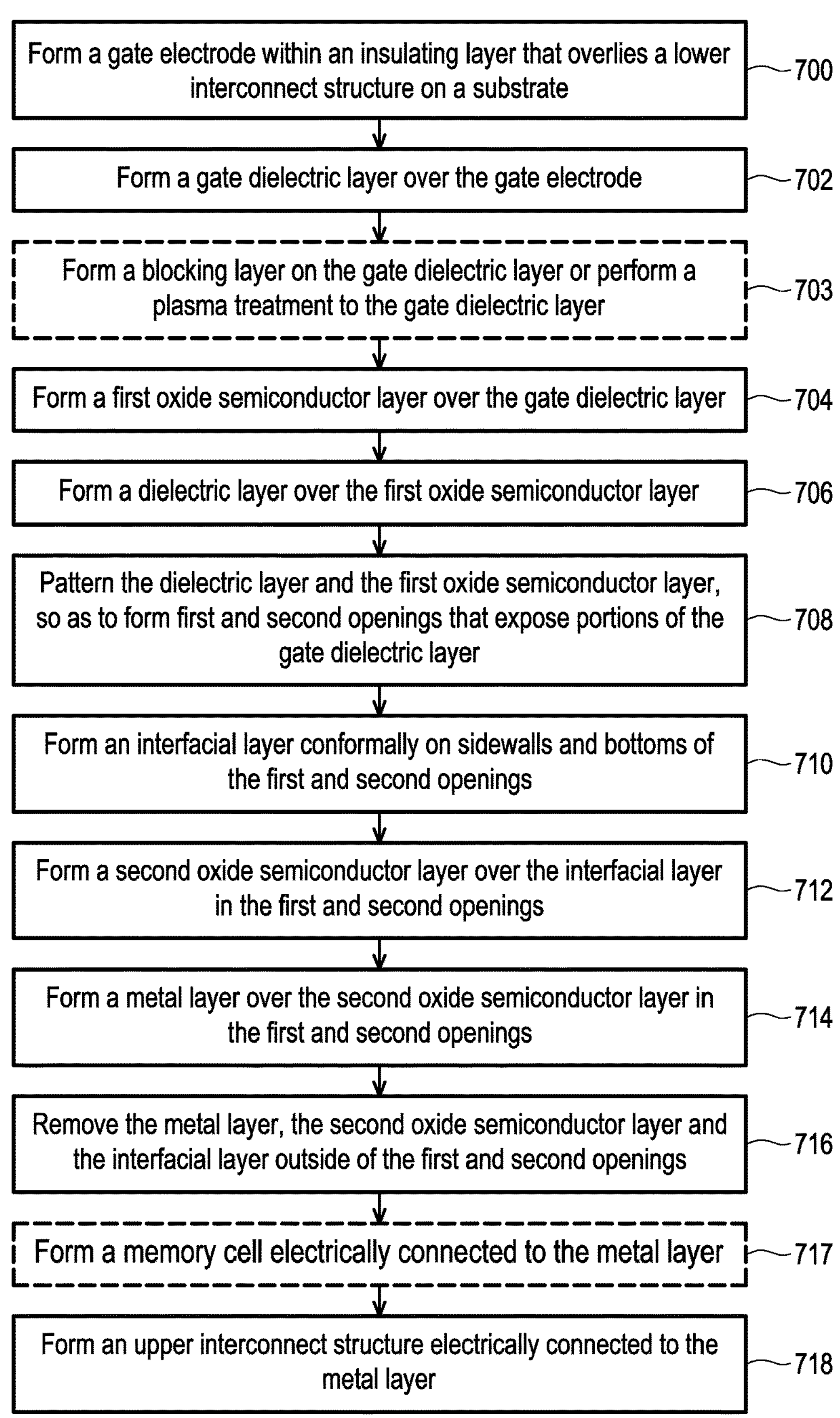
FIG. 34 illustrates a flow chart of a method of forming a semiconductor structure in accordance with some embodiments.

FIG. 34 illustrates a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 700, a gate electrode within an insulating layer that overlies a lower interconnect structure on a substrate. FIG. 1 to FIG. 4, FIG. 14 and FIG. 23 illustrate cross-sectional views corresponding to some embodiments of act 700.

At act 702, a gate dielectric layer is formed over the gate electrode. FIG. 4, FIG. 14 and FIG. 23 illustrate cross-sectional views corresponding to some embodiments of act 702.

At act 703, a blocking layer is formed on the gate dielectric layer or a plasma treatment is performed to the gate dielectric layer. FIG. 15 and FIG. 24 illustrate cross-sectional views corresponding to some embodiments of act 703. In some embodiments, when the blocking layer is formed by a deposition process, the blocking layer includes hafnium oxide, zirconium oxide, gallium oxide, tungsten oxide, aluminum oxide, silicon oxide, or a combination thereof. In some embodiments, when the blocking layer is formed by a plasma treatment, the plasma treatment includes ozone, $O_2$, $N_2O$, $NH_3$, $N_2$ or a combination thereof. Act 703 is optional and may be omitted as need.

At act 704, a first oxide semiconductor layer is formed over the gate dielectric layer. FIG. 5, FIG. 16 and FIG. 25 illustrate cross-sectional views corresponding to some embodiments of act 704. In some embodiments, the first oxide semiconductor layer and the gate dielectric layer are patterned to form a film stack, as shown in FIG. 6, FIG. 17 and FIG. 26.

At act 706, a dielectric layer is formed over the first oxide semiconductor layer. FIG. 7, FIG. 18 and FIG. 27 illustrate cross-sectional views corresponding to some embodiments of act 706.

At act 708, the dielectric layer and the first oxide semiconductor layer are patterned, so as to form first and second openings that expose portions of the gate dielectric layer. FIG. 8, FIG. 19 and FIG. 28 illustrate cross-sectional views corresponding to some embodiments of act 708.

At act 710, an interfacial layer is formed conformally on sidewalls and bottoms of the first and second openings. FIG. 3 illustrates a cross-sectional view corresponding to some embodiments of act 710. In some embodiments, the interfacial layer is in physical contact with the gate dielectric layer and the second oxide semiconductor layer. In some embodiments, the interfacial layer includes TiN, WCN, W, TaN, Ru, Al, InO, IZO, ITO or a combination thereof.

At act 712, a second oxide semiconductor layer is formed over the interfacial layer in the first and second openings. FIG. 10, FIG. 20 and FIG. 29 illustrate cross-sectional views corresponding to some embodiments of act 712. In some embodiments, the second oxide semiconductor layer is more conductive than the first oxide semiconductor layer. In some embodiments, the first oxide semiconductor layer has a carrier density ranging from about $1\times10^{14}/cm^3$ to $1\times10^{18}/cm^3$, and the second oxide semiconductor layer has a carrier density of about $1\times10^{19}/cm^3$ or more.

At act 714, a metal layer is formed over the second oxide semiconductor layer in the first and second openings. FIG. 11, FIG. 21 and FIG. 30 illustrate cross-sectional views corresponding to some embodiments of act 714.

At act 716, the metal layer, the second oxide semiconductor layer and the interfacial layer outside of the first and second openings are removed. FIG. 12, FIG. 22 and FIG. 31 illustrate cross-sectional views corresponding to some embodiments of act 716.

At act 717, a memory cell is formed to electrically connect to the metal layer. FIG. 13 illustrates a cross-sectional view corresponding to some embodiments of act 717. Act 717 is optional and may be omitted as need.

At act 718, an upper interconnect structure is formed to electrically connect to the metal layer. FIG. 13 illustrates a cross-sectional view corresponding to some embodiments of act 718.

Figure 35:
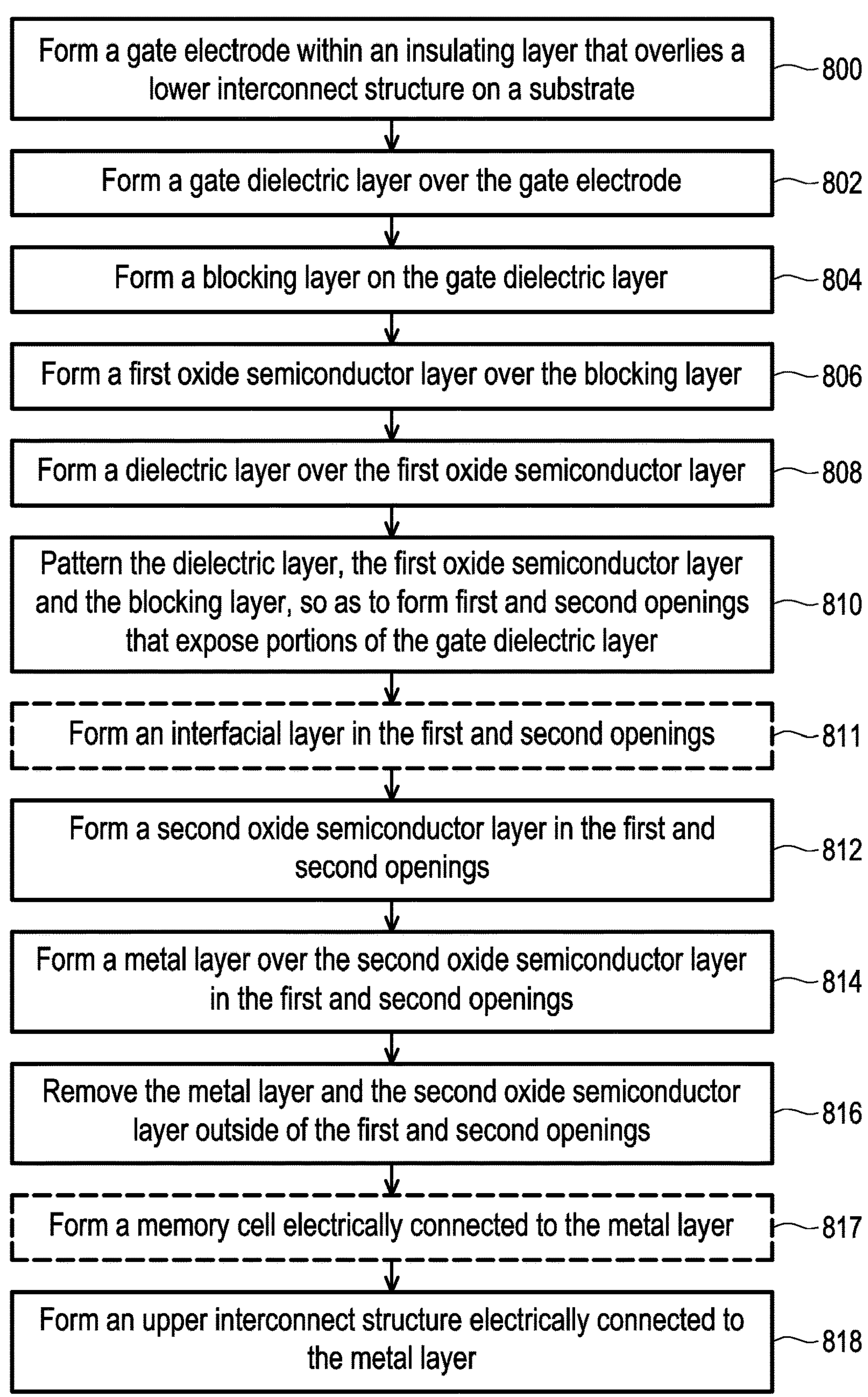
FIG. 35 illustrates a flow chart of a method of forming a semiconductor structure in accordance with some embodiments.

FIG. 35 illustrates a flow chart of a method of forming a semiconductor structure in accordance with some embodiments. Although the method is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 800, a gate electrode is formed within an insulating layer that overlies a lower interconnect structure on a substrate. FIG. 14 and FIG. 23 illustrate cross-sectional views corresponding to some embodiments of act 800.

At act 802, a gate dielectric layer is formed over the gate electrode. FIG. 14 and FIG. 23 illustrate cross-sectional views corresponding to some embodiments of act 802.

At act 804, a blocking layer is formed on the gate dielectric layer. FIG. 15 and FIG. 24 illustrate cross-sectional views corresponding to some embodiments of act 804. In some embodiments, the blocking layer is formed by a deposition process, as shown in FIG. 15. In some embodiments, the blocking layer is formed by a surface treatment, as shown in FIG. 24.

At act 806, a first oxide semiconductor layer is formed over the blocking layer. FIG. 16 and FIG. 25 illustrate cross-sectional views corresponding to some embodiments of act 806. In some embodiments, the first oxide semiconductor layer and the gate dielectric layer are patterned to form a film stack, as shown in FIG. 17 and FIG. 26.

At act 808, a dielectric layer is formed over the first oxide semiconductor layer. FIG. 7, FIG. 18 and FIG. 27 illustrate cross-sectional views corresponding to some embodiments of act 808.

At act 810, the dielectric layer, the first oxide semiconductor layer and the blocking layer are patterned, so as to form first and second openings that expose portions of the gate dielectric layer. FIG. 19 and FIG. 28 illustrate cross-sectional views corresponding to some embodiments of act 810.

At act 811, an interfacial layer is formed in the first and second openings. FIG. 32 and FIG. 33 illustrate cross-sectional views corresponding to some embodiments of act 708. In some embodiments, the interfacial layer includes TiN, WCN, W, TaN, Ru, Al, InO, IZO, ITO or a combination thereof. At act 811 is optional and may be omitted as need.

At act 812, a second oxide semiconductor layer is formed in the first and second openings. FIG. 20 and FIG. 29 illustrate cross-sectional views corresponding to some embodiments of act 812. In some embodiments, the second oxide semiconductor layer is more conductive than the first oxide semiconductor layer.

At act 814, a metal layer is formed over the second oxide semiconductor layer in the first and second openings. FIG. 21 and FIG. 30 illustrate cross-sectional views corresponding to some embodiments of act 814.

At act 816, the metal layer and the second oxide semiconductor layer outside of the first and second openings are removed. FIG. 22 and FIG. 31 illustrate cross-sectional views corresponding to some embodiments of act 816.

At act 817, a memory cell is formed to electrically connect to the metal layer. FIG. 13 illustrates a cross-sectional view corresponding to some embodiments of act 817. At act 817 is optional and may be omitted as need.

At act 818, an upper interconnect structure is formed to electrically connect to the metal layer. FIG. 13 illustrates a cross-sectional view corresponding to some embodiments of act 818.

The structures of the present disclosure are illustrated below with reference to the cross-sectional views of the above figures. In some embodiments, a semiconductor device (e.g., TFT device 400/403/404) includes a gate electrode 15, a gate dielectric layer 10, an active layer 20, a dielectric layer 48, a source electrode 52S and a drain electrode 52D. The gate electrode 15 is embedded by an insulating layer 42 over a substrate 8. The gate dielectric layer 10 is disposed over the gate electrode 15. The active layer 20 is disposed over the gate dielectric layer 10. The dielectric layer 48 is disposed over the active layer 20. The source electrode 52S and the drain electrode 52D penetrate through the dielectric layer 48 and the active layer 20 and in contact with the gate dielectric layer 10. In some embodiments, the source electrode 52S includes, from bottom to top, a first interfacial liner 22S, a first buffer layer 24S and a first metal fill layer 26S, and the drain electrode 52D includes, from bottom to top, a second interfacial liner 22D, a second buffer layer 24D and a second metal fill layer 26D.

In some embodiments, the first interfacial liner 22S is more conductive than the first buffer layer 24S, and the second interfacial liner 22D is more conductive than the second buffer layer 24D.

In some embodiments, the first and second interfacial liners 22S/22D include TiN, WCN, W, TaN, Ru, Al, InO, IZO, ITO or a combination thereof. In some embodiments, the second buffer layers 24S/24D include IZO, IGO, IGZO, IWO, IWZO, InO, ITO or a combination thereof. In some embodiments, the first and second interfacial liners 22S/22D have a carrier density higher than that of the first and second buffer layers 24S/24D. For example, the first and the second buffer layers 24S/24D have a carrier density of about $1\times10^{19}/cm^3$ or more, such as from about $1\times10^{19}/cm^3$ to $1\times10^{21}/cm^3$, and the first and second interfacial liners 22S/22D have a carrier density of about $1\times10^{20}/cm^3$ or more, such as from about $1\times10^{20}/cm^3$ to $1\times10^{22}/cm^3$.

In some embodiments, the active layer 20 includes a first oxide semiconductor material, the first and second buffer layers 24S/24D include a second oxide semiconductor material, and the first oxide semiconductor material is more conductive than the first oxide semiconductor layer. In some embodiments, the first oxide semiconductor layer has a carrier density ranging from about $1\times10^{14}/cm^3$ to $1\times10^{18}/cm^3$, and the second oxide semiconductor layer has a carrier density of about $1\times10^{19}/cm^3$ or more.

In some embodiments, the first interfacial liner 22S is in physical contact with the gate dielectric layer 10 and the first buffer layer 24S, and the second interfacial liner 22D is in physical contact with the gate dielectric layer 10 and the second buffer layer 24D.

In some embodiments, the semiconductor device (e.g., TFT device 403/404) further includes a blocking layer 12/19 disposed between the gate dielectric layer 10 and the active layer 20, wherein the blocking layer 12/19 and the gate dielectric layer 10 include different materials.

The various embodiments of the present disclosure may be used to reduce out-diffusion of a metallic element from the active layer to the underlying gate electric layer by providing metal-diffusion-resistant blocking layer or interfacial layer. Blocking metal out-diffusion out of the active layer prevents compositional changes within the active layer or the gate electric layer, and thus, may help maintain the device characteristics of the thin film transistor constant throughout the operational lifetime of the thin film transistor.

According to an aspect of the present disclosure, a method of forming a semiconductor device is provided. The method may include the operations of: forming a gate electrode within an insulating layer that overlies a substrate; forming a gate dielectric layer over the gate electrode; forming a first oxide semiconductor layer over the gate dielectric layer; forming a dielectric layer over the first oxide semiconductor layer; patterning the dielectric layer and the first oxide semiconductor layer, so as to form first and second openings that expose portions of the gate dielectric layer; forming an interfacial layer conformally on sidewalls and bottoms of the first and second openings; forming a second oxide semiconductor layer over the interfacial layer in the first and second openings; and forming a metal layer over the second oxide semiconductor layer in the first and second openings.

According to an aspect of the present disclosure, a method of forming a semiconductor device is provided. The method may include the operations of: forming a gate electrode within an insulating layer that overlies a substrate; forming a gate dielectric layer over the gate electrode; forming a blocking layer on the gate dielectric layer; forming a first oxide semiconductor layer over the blocking layer; forming a dielectric layer over the first oxide semiconductor layer; patterning the dielectric layer, the first oxide semiconductor layer and the blocking layer, so as to form first and second openings that expose portions of the gate dielectric layer; forming a second oxide semiconductor layer in the first and second openings; and forming a metal layer over the second oxide semiconductor layer in the first and second openings.

According to an aspect of the present disclosure, a semiconductor device includes: a gate electrode embedded by an insulating layer over a substrate; a gate dielectric layer disposed over the gate electrode; an active layer disposed over the gate dielectric layer; a dielectric layer disposed over the active layer; and a source electrode and a drain electrode penetrating through the dielectric layer and the active layer and in contact with the gate dielectric layer. In some embodiments, the source electrode includes, from bottom to top, a first interfacial liner, a first buffer layer and a first metal fill layer, and the drain electrode includes, from bottom to top, a second interfacial liner, a second buffer layer and a second metal fill layer. In some embodiments, the first interfacial liner is more conductive than the first buffer layer, and the second interfacial liner is more conductive than the second buffer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:

forming a gate electrode within an insulating layer that overlies a substrate;

forming a gate dielectric layer over the gate electrode;

forming a semiconductor channel layer over the gate dielectric layer;

forming a dielectric layer over the semiconductor channel layer;

patterning the dielectric layer and the semiconductor channel layer, so as to form first and second openings that expose portions of the gate dielectric layer, wherein bottom surfaces of the first and second openings are substantially flush with a top surface of the gate dielectric layer;

forming an interfacial layer conformally on sidewalls and bottoms of the first and second openings, wherein the gate dielectric layer is a single layer, the top surface of the gate dielectric layer is in physical contact with the interfacial layer, and a bottom surface of the gate dielectric layer is in physical contact with the gate electrode;

forming a semiconductor layer over the interfacial layer in the first and second openings; and forming a metal layer over the semiconductor layer in the first and second openings.

2. The method of claim 1, wherein the interfacial layer is in physical contact with the semiconductor layer.

3. The method of claim 1, wherein the interfacial layer comprises TiN, WCN, W, TaN, Ru, Al, InO, IZO, ITO or a combination thereof.

4. The method of claim 1, wherein the semiconductor layer is more conductive than the semiconductor channel layer, and the semiconductor layer and the semiconductor channel layer have a carrier density of about $1\times10^{14}/cm^3$ or more.

5. The method of claim 4, wherein the semiconductor channel layer has a carrier density ranging from about $1\times10^{14}/cm^3$ to $1\times10^{18}/cm^3$, and the semiconductor layer has a carrier density of about $1\times10^{19}/cm^3$ or more.

6. The method of claim 1, further comprising forming a blocking layer between the gate dielectric layer and the semiconductor channel layer.

7. The method of claim 6, wherein the blocking layer comprises hafnium oxide, zirconium oxide, gallium oxide, tungsten oxide, aluminum oxide, silicon oxide, or a combination thereof.

8. The method of claim 1, further comprising performing a plasma treatment after forming the gate dielectric layer and before forming the semiconductor channel layer.

9. The method of claim 8, wherein the plasma treatment comprises ozone, $O_2$, $N_2O$, $NH_3$, $N_2$ or a combination thereof.

10. A method of forming a semiconductor device, comprising:

forming a gate electrode within an insulating layer that overlies a substrate;

forming a gate dielectric layer over the gate electrode;

forming a blocking layer on the gate dielectric layer;

forming a semiconductor channel layer over the blocking layer;

forming a dielectric layer over the semiconductor channel layer;

patterning the dielectric layer, the semiconductor channel layer and the blocking layer, so as to form first and second openings that expose portions of the gate dielectric layer, wherein bottom surfaces of the first and second openings are substantially flush with a top surface of the gate dielectric layer;

forming an interfacial layer in the first and second openings, wherein the gate dielectric layer is a single layer, the top surface of the gate dielectric layer is in physical contact with the interfacial layer, and a bottom surface of the gate dielectric layer is in physical contact with the gate electrode;

forming a semiconductor layer in the first and second openings; and forming a metal layer over the semiconductor layer in the first and second openings.

11. The method of claim 10, wherein the blocking layer comprises hafnium oxide, zirconium oxide, gallium oxide, tungsten oxide, aluminum oxide, silicon oxide, or a combination thereof.

12. The method of claim 10, wherein the semiconductor layer is more conductive than the semiconductor channel layer.

13. The method of claim 10, wherein the semiconductor layer is formed on the interfacial layer such that the interfacial layer covers a bottom surface and sidewalls of the semiconductor layer.

14. The method of claim 13, wherein the interfacial layer comprises TiN, WCN, W, TaN, Ru, Al, InO, IZO, ITO or a combination thereof.

15. A method of forming a semiconductor device, comprising:

forming a gate electrode within an insulating layer over a transistor;

forming a gate dielectric layer over the gate electrode;

forming a semiconductor channel layer over the gate dielectric layer;

forming a dielectric layer over the semiconductor channel layer;

forming first and second openings in the dielectric layer and the channel semiconductor layer, wherein bottom surfaces of the first and second openings are substantially flush with a top surface of the gate dielectric layer;

forming an interfacial layer in the first and second openings, wherein the gate dielectric layer is a single layer, the top surface of the gate dielectric layer is in physical contact with the interfacial layer, and a bottom surface of the gate dielectric layer is in physical contact with the gate electrode;

forming a semiconductor layer in the first and second openings; and forming a metal layer over the semiconductor layer in the first and second openings.

16. The method of claim 15, wherein the interfacial layer is conformally formed on sidewalls and bottoms of the first and second openings.

17. The method of claim 15, wherein the semiconductor layer is more conductive than the semiconductor channel layer.

18. The method of claim 15, further comprising forming a blocking layer between the gate dielectric layer and the semiconductor channel layer.

19. The method of claim 15, further comprising performing a plasma treatment after forming the gate dielectric layer and before forming the semiconductor channel layer.

20. The method of claim 15, further comprising forming a memory cell electrically connected to the metal layer.

* * * * *